United States Patent
Tseng et al.

(10) Patent No.: US 12,532,511 B2
(45) Date of Patent: Jan. 20, 2026

(54) BARRIER LAYERS IN SEMICONDUCTOR DEVICES

(71) Applicant: Taiwan Semiconductor Manufacturing Company, Ltd., Hsinchu (TW)

(72) Inventors: Hsin Hsiang Tseng, Hsinchu (TW); Ming-Nung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 326 days.

(21) Appl. No.: 18/116,209

(22) Filed: Mar. 1, 2023

(65) Prior Publication Data

US 2024/0297233 A1    Sep. 5, 2024

(51) Int. Cl.
| | | |
|---|---|---|
| H10D 30/67 | (2025.01) | |
| H10D 30/01 | (2025.01) | |
| H10D 30/43 | (2025.01) | |
| H10D 62/10 | (2025.01) | |
| H10D 84/01 | (2025.01) | |
| H10D 84/03 | (2025.01) | |
| H10D 84/85 | (2025.01) | |

(52) U.S. Cl.
CPC ....... *H10D 30/6735* (2025.01); *H10D 30/014* (2025.01); *H10D 30/43* (2025.01); *H10D 30/6729* (2025.01); *H10D 30/6757* (2025.01); *H10D 62/121* (2025.01); *H10D 84/017* (2025.01); *H10D 84/0186* (2025.01); *H10D 84/038* (2025.01); *H10D 84/85* (2025.01)

(58) Field of Classification Search
CPC ............. H10D 30/6735; H10D 30/014; H10D 30/6757; H10D 30/43; H10D 30/6729; H10D 84/0186; H10D 84/85; H10D 84/017; H10D 84/038; H10D 62/121
USPC ........................................................ 257/288
See application file for complete search history.

(56) References Cited

U.S. PATENT DOCUMENTS

| | | |
|---|---|---|
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |

(Continued)

FOREIGN PATENT DOCUMENTS

TW    202230476 A    8/2022

*Primary Examiner* — Tu-Tu V Ho
(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming a fin base on a substrate, epitaxially growing a S/D region on the fin base, depositing a dielectric layer on the S/D region, forming a contact structure on the S/D region through the dielectric layer, removing a portion of the dielectric layer to expose sidewalls of the contact structure, forming a barrier layer on the dielectric layer and to cover the exposed sidewalls of the contact structure, and forming a via structure on the contact structure through the barrier layer. The formation of the barrier layer includes depositing an insulating layer with a dielectric constant and a material density higher than a dielectric constant and a material density of the dielectric layer.

20 Claims, 42 Drawing Sheets

(56) References Cited

U.S. PATENT DOCUMENTS

| | | |
|---|---|---|
| 9,330,963 B2 * | 5/2016 | King .................. H01L 21/0228 |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 2022/0238660 A1 | 7/2022 | Huang et al. |
| 2022/0344465 A1 | 10/2022 | Chen et al. |

\* cited by examiner

BARRIER LAYERS IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the challenges of manufacturing highly reliable semiconductor devices.

BRIEF DESCRIPTION OF THE DRAWINGS

Aspects of this disclosure are best understood from the following detailed description when read with the accompanying figures.

FIGS. 3A-18A and 3B-18B illustrate cross-sectional views of a semiconductor device with a barrier layer at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
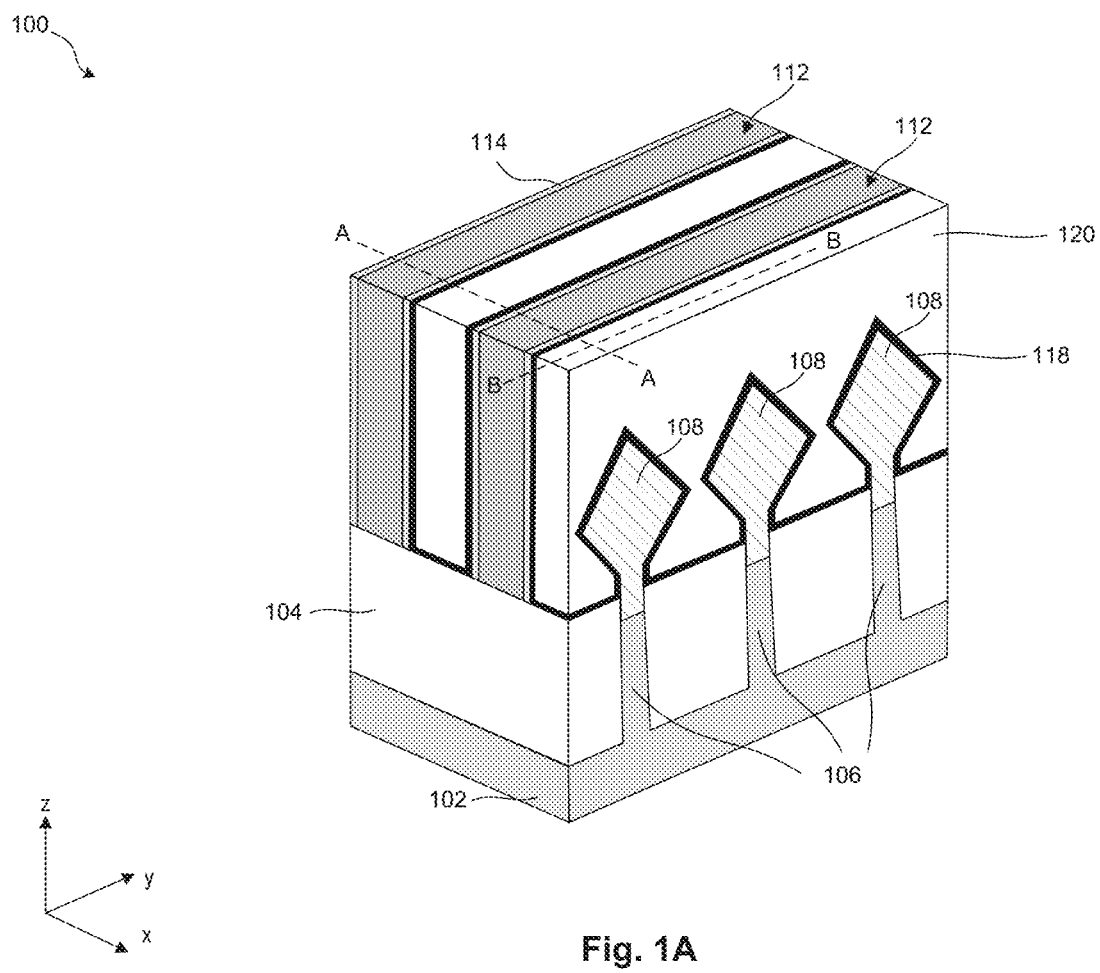
FIG. 1A illustrates an isometric view of a semiconductor device with a barrier layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The reliability and performance of semiconductor devices (e.g., MOSFETs, finFETs, or GAA FETs) have been negatively impacted by the scaling down of semiconductor devices. The scaling down has resulted in smaller electrical isolation regions between contact structures on source/drain (S/D) regions and between via structures on the contact structures. The dielectric layers in such smaller electrical isolation regions may not adequately prevent conductive material leakage between adjacent via structures. As a result, current leakage through the conductive path formed between adjacent via structures can degrade the performance and reliability of the semiconductor device. Source/drain region(s) may refer to a source or a drain, individually or collectively dependent upon the context.

To address the abovementioned challenges, the present disclosure provides example structures of barrier layers between adjacent contact structures and between adjacent via structures in FETs (e.g., finFETs and GAA FETs) and provides methods of forming the barrier layers. The barrier layers can prevent current leakage between the adjacent contact structures and between the adjacent via structures. In some embodiments, a FET can include contact structures disposed on S/D regions and via structures disposed on the contact structures. First portions (also referred to as "via-anchors" or "via-bases") of the via structures can be disposed in the contact structures and second portions (also referred to as "via-tops") of the via structures can extend above the top surfaces of the contact structures. In some embodiments, the via-bases can be wider than the via-tops, which can result in adjacent via-bases being closer to each other than adjacent via-tops. In some embodiments, to prevent conductive material leakage between adjacent via-bases that are spaced apart from each other by a distance less than about 30 nm, the FET can include a barrier layer disposed between the adjacent via-bases. In some embodiments, the barrier layer can have a height equal to or greater than a height of the via-bases. In some embodiments, the barrier layer can include an insulating nitride layer with a high dielectric constant greater than about 7. The high dielectric constant of the barrier layer can minimize the probability of electrical breakdown of the barrier layer and prevent leakage of conductive material between the via-bases.

Figure 1B:
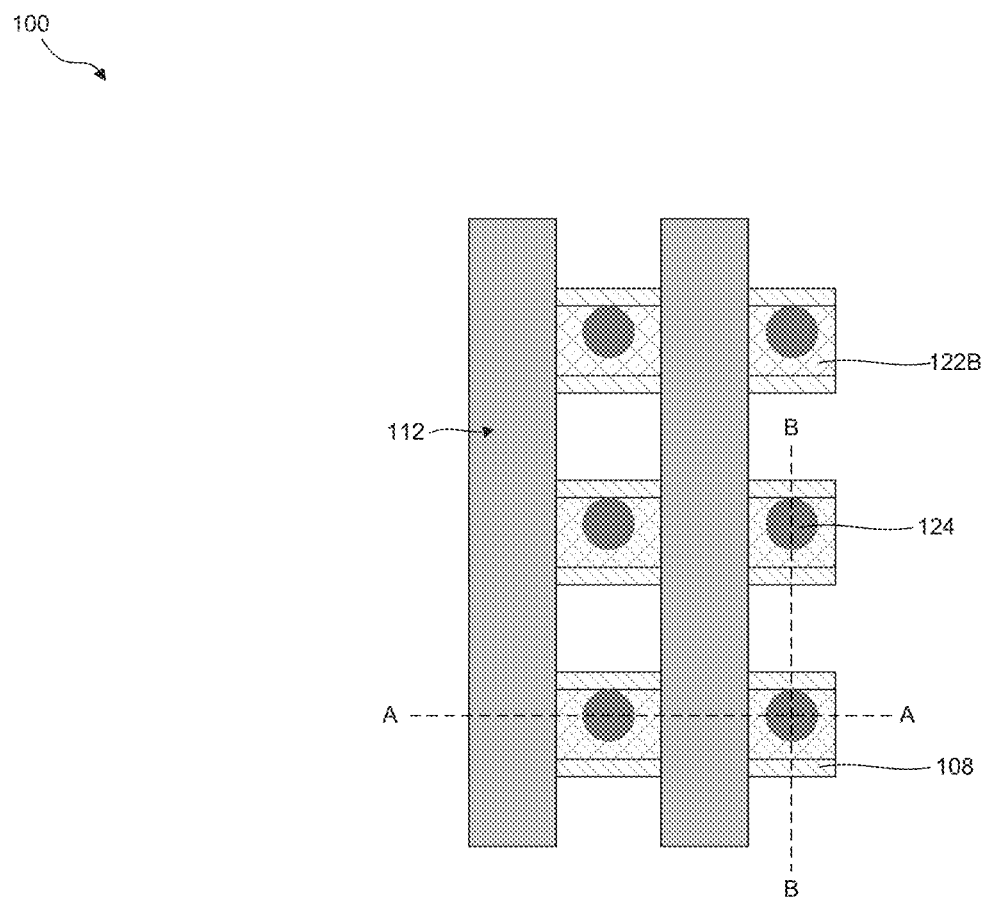
FIG. 1B illustrates a top-down view of a semiconductor device with a barrier layer, in accordance with some embodiments.
Figure 1B:
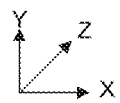
Figure 1C:
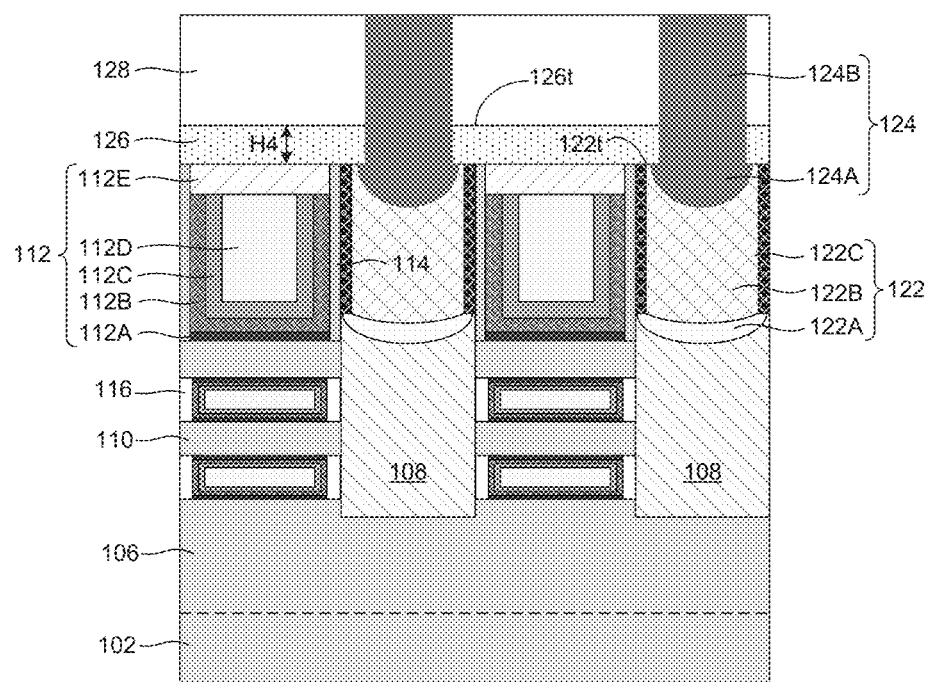
FIGS. 1C-1I illustrate different cross-sectional views of a semiconductor device with a barrier layer, in accordance with some embodiments.
Figure 1D:
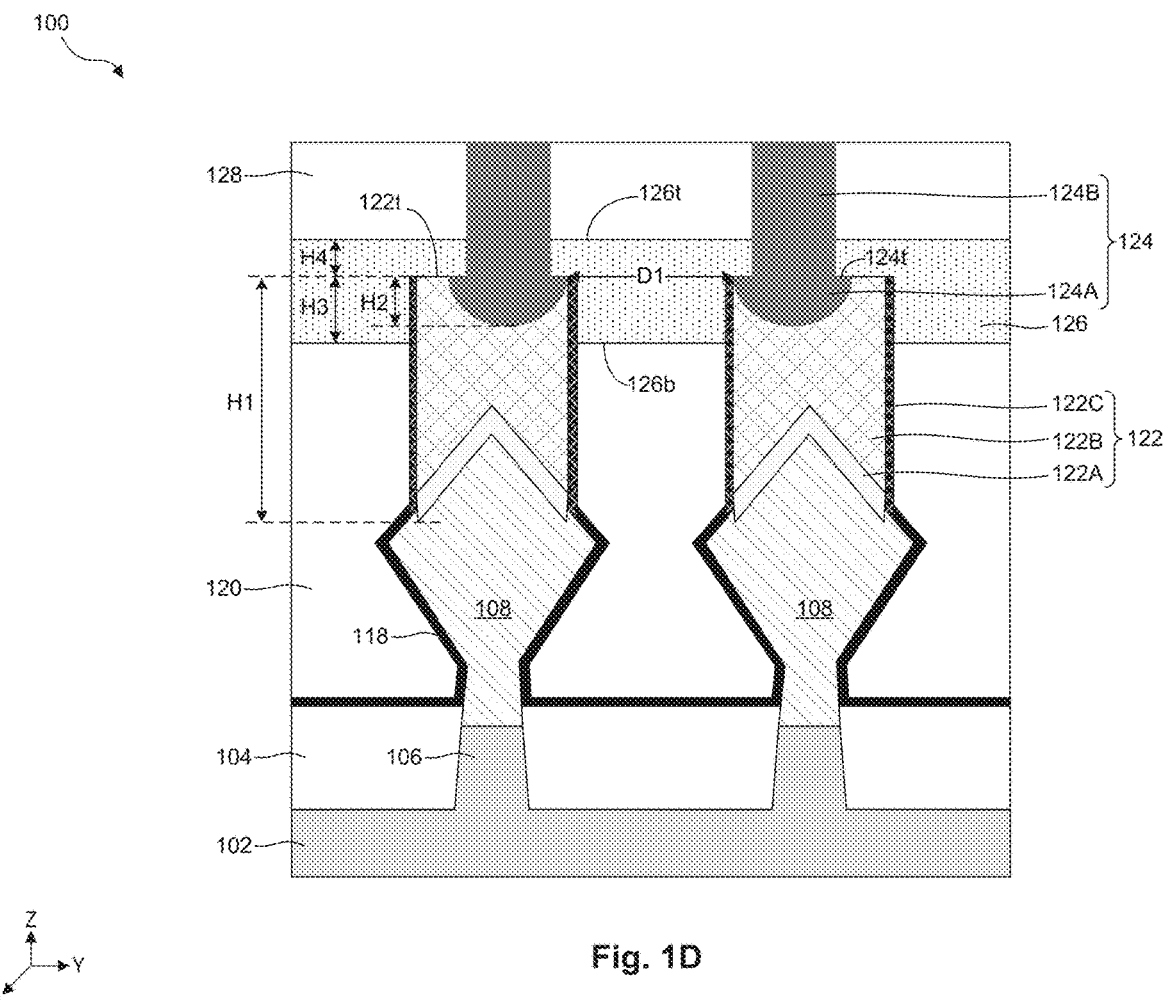

FIG. 1A illustrates an isometric view of a FET 100 (also referred to as a "GAA FET 100"), according to some embodiments. FIG. 1B illustrates a top-down view of FET 100, according to some embodiments. FIGS. 1C, IE, 1F, and 1H illustrate different cross-sectional views of FET 100 along lines A-A of FIGS. 1A and 1B, according to some embodiments. FIGS. 1D, 1G, and 1I illustrate different cross-sectional views of FET 100, along lines B-B of FIGS. 1A and 1B, according to some embodiments. FIGS. 1C, 1D, 1E, 1F, 1G, 1H, and 1I illustrate cross-sectional views of FET 100 with additional structures that are not shown in FIGS. 1A and 1B for simplicity. The discussion of elements with the same annotations applies to each other, unless mentioned otherwise.

Referring to FIGS. 1A-ID, in some embodiments, FET 100 can include (i) a substrate 102, (ii) shallow trench isolation (STI) regions 104 disposed on substrate, (iii) fin bases 106 disposed on substrate 102, (iv) S/D regions 108 disposed on fin bases 106, (v) nanostructured channel regions 110 disposed on fin bases 106, (vi) gate structures 112 disposed on nanostructured channel regions 110, (vii) outer gate spacers 114, (viii) inner gate spacers 116, (ix) etch stop layers (ESLs) 118 disposed on S/D regions 108, (x) first interlayer dielectric (ILD) layers 120 disposed on ESLs 118, (xi) contact structures 122 disposed on S/D regions 108, (xii) via structures 124 disposed on contact structures 122, (xiii) a barrier layer 126 disposed on first ILD layers 120, and (xiv) second ILD layer 128 disposed on barrier layer 126. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 110 can be in the form of nanosheets, nanowires, nanorods, nanotubes, or other suitable nanostructured shapes.

In some embodiments, substrate 102 can be a semiconductor material, such as silicon, germanium (Ge), silicon germanium (SiGe), a silicon-on-insulator (SOI) structure, and a combination thereof. Further, substrate 102 can be doped with p-type dopants (e.g., boron, indium, aluminum, or gallium) or n-type dopants (e.g., phosphorus or arsenic).

In some embodiments, STI regions 104 can include an insulating material, such as silicon oxide ($SiO_2$), silicon nitride (SiN), silicon oxynitride (SiON), silicon carbon nitride (SiCN), silicon oxycarbon nitride (SiOCN), and silicon germanium oxide ($SiGeO_x$). In some embodiments, fin bases 106 can include a material similar to substrate 102. Fin bases 106 can have elongated sides extending along an X-axis.

In some embodiments, S/D regions 108 can include an epitaxially-grown semiconductor material, such as Si, and n-type dopants, such as phosphorus and other suitable n-type dopants. In some embodiments, S/D regions 108 can include an epitaxially-grown semiconductor material, such as Si and SiGe, and p-type dopants, such as boron and other suitable p-type dopants.

In some embodiments, nanostructured channel regions 110 can include semiconductor materials similar to or different from substrate 102. In some embodiments, nanostructured channel regions 110 can include Si, SiAs, silicon phosphide (SiP), SiC, SiCP, SiGe, silicon germanium boron (SiGeB), germanium boron (GeB), silicon-germanium-tin-boron (SiGeSnB), a III-V semiconductor compound, or other suitable semiconductor materials. Though rectangular cross-sections of nanostructured channel regions 110 are shown, nanostructured channel regions 110 can have cross-sections of other geometric shapes (e.g., circular, elliptical, triangular, or polygonal). In some embodiments, FET 100 can be a finFET and can have fin regions (not shown) instead of nanostructured channel regions 110.

In some embodiments, gate structures 112 can surround each of nanostructured channel regions 110. In some embodiments, gate structure 112 can be electrically isolated from adjacent contact structure 122 by outer gate spacers 114 and the portions of gate structures 112 surrounding nanostructured channel regions 110 can be electrically isolated from adjacent S/D regions 108 by inner gate spacers 116. Outer gate spacers 114 and inner gate spacers 116 can include a material similar to or different from each other. In some embodiments, outer gate spacers 114 and inner gate spacers 116 can include an insulating material, such as $SiO_2$, SiN, SiON, SiCN, SiOCN, and $SiGeO_x$. Outer gate spacers 114 are not shown in FIG. 1B for simplicity.

In some embodiments, each gate structure 112 can be a multi-layered structure and can surround nanostructured channel regions 110 for which gate structures 112 can be referred to as "GAA structures." In some embodiments, each gate structure 112 can include (i) an interfacial oxide (IL) layer 112A, (ii) a high-k (HK) gate dielectric layer 112B disposed on IL layer 112A, (iii) a work function metal (WFM) layer 112C disposed on HK gate dielectric layer 112B, (iv) a gate metal fill layer 112D disposed on WFM layer 112C, and (v) a conductive capping layer 112E disposed on gate metal fill layer 112D. In some embodiments, IL layer 112A can include $SiO_2$, $SiGeO_x$, or germanium oxide ($GeO_x$). In some embodiments, HK gate dielectric layer 112B can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, WFM layer 112C can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for GAA NFET 100. In some embodiments, WFM layer 112D can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for GAA PFET 100. In some embodiments, gate metal fill layer 112D can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Conductive capping layer 112E can provide a conductive interface between gate metal fill layer 112D and a gate contact structure (not shown) to electrically connect gate metal fill layer 112D to the gate contact structure without forming the gate contact structure directly on or within gate metal fill layer 112D. The gate contact structure is not formed directly on or within gate metal fill layer 112D to prevent contamination by any of the processing materials used in the formation of the gate contact structure. Contamination of gate metal fill layer 112D can lead to the degradation of device performance. Thus, with the use of conductive capping layer 112E, gate structure 112 can be electrically connected to the gate contact structure without compromising the integrity of gate structure 112.

In some embodiments, conductive capping layer 112E can have a thickness of about 1 nm to about 8 nm for adequately providing a conductive interface between gate metal fill layer 112D and the gate contact structure without compromising the size and manufacturing cost of FET 100. In some embodiments, the total thickness of conductive capping layer 112E and gate metal fill layer 112D can range from about 10 nm to about 30 nm. In some embodiments, conductive capping layer 112E can include a metallic material, such as W, Ru, Mo, Co, other suitable metallic materials, and a combination thereof. In some embodiments, conductive capping layer 112E can be formed using a precursor gas of tungsten pentachloride ($WCl_5$) or tungsten hexachloride ($WCl_6$), and as a result, conductive capping layer 112E can include tungsten with impurities of chlorine atoms. The concentration of chlorine atom impurities can range from about 1 atomic percent to about 10 atomic percent of the total concentration of atoms in each conductive capping layer 112E.

In some embodiments, ESLs 118 can be disposed on portions of S/D regions 108 that are not covered by contact structures 122, and ILD layers 120 can be disposed on ESLs 118. In some embodiments, ESLs 118 and ILD layers 120 can include an insulating material, such as $SiO_2$, SiN, SiON, SiCN, SiOCN, and $SiGeO_x$. ESLs 118 and ILD layers 120 are not shown in FIG. 1B for simplicity.

In some embodiments, each contact structure 122 can include (i) a silicide layer 122A disposed on S/D region 108, (ii) a contact plug 122B disposed on silicide layer 122A, and (iii) a contact liner 122C surrounding contact plug 122B. In some embodiments, each silicide layer 122A can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof for GAA NFET 100. In some embodiments, each silicide layer 122A can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof for GAA PFET 100.

In some embodiments, each contact plug 122B can include conductive materials with low resistivity (e.g., resistivity of about 50 μΩ-cm, about 40 μΩ-cm, about 30 μΩ-cm, about 20 μΩ-cm, or about 10 μΩ-cm), such as Co, W, Ru, Al, Mo, iridium (Ir), nickel (Ni), Osmium (Os), rhodium (Rh), other suitable conductive materials with low resistivity, and a combination thereof. In some embodiments, contact plug 122B can have a height H1 of about 10 nm to about 150 nm. Within this range of height H1, contact plug 122B can provide adequate electrical conductivity between S/D regions 108 and overlying interconnect structures (not shown) without compromising the size and manufacturing cost of FET 100.

Each contact liner 122C can prevent the oxidation of contact plug 122B by preventing the diffusion of oxygen atoms from adjacent structures (e.g., ILD layers 120) to contact plug 122B. In some embodiments, contact liner 122C can include a dielectric nitride or carbide material, such as SiN, SiCN, silicon carbide (SiC), and other suitable dielectric nitride or carbide materials. In some embodiments, contact liner 122C can have a thickness of about 1.5 nm to about 4 nm. Within this range of thickness, contact liner 122C can adequately prevent the oxidation of contact plug 122B without compromising the size and manufacturing cost of FET 100. In some embodiments, top surfaces of contact plugs 122B, contact liners 122C, and conductive capping layers 112E can be substantially coplanar with each other.

In some embodiments, each via structure 124 can be adhesion liner-free and can include a metallic material, such as W, Ru, Mo, Co, other suitable metallic materials, and a combination thereof. In some embodiments, each via structure 124 can include a via-base 124A and a via-top 124B. Via-bases 124A can be disposed in contact structures 122 and via-tops 124B can extend over top surfaces 122t of contact plugs 122B. In some embodiments, top surfaces 124t of via-bases 124A can be substantially coplanar with top surfaces 122t of contact plugs 122B. In some embodiments, via-bases 124A can have a height H2 of about 3 nm to about 15 nm. Within this range of height H2, via-bases 124A can form an adequate conductive interface with contact plugs 122B and minimize contact resistance between via structures 124 and contact structures 122. In some embodiments, via-bases 124A can have semi-spherical shapes or arcuate shapes that are wider than the width of via-tops 124B. Since via structures 124 are formed without adhesion liners, the wider semi-spherical shaped or arcuate shaped via-bases 124A can prevent the metallic material of via structures 124 from being pulled out from via openings (not shown) formed in contact structures 122 during the formation of via structures 124.

In some embodiments, a portion of barrier layer 126 can be disposed on and in direct contact with gate structures 112, as shown in FIG. 1C, and another portion of barrier layer 126 can be disposed on and in direct contact with ILD layers 120, as shown in FIG. 1D. And, barrier layer 126 can be disposed between adjacent contact structures 122 and between adjacent via structures 124. Barrier layer 126 can provide electrical isolation between contact structures 122 and between via structures 124. Furthermore, barrier layer 126 can be configured to prevent the formation of a current leakage path between adjacent via-bases 124A that are closely spaced by a distance DI, which can be less than about 30 nm.

In some embodiments, to prevent the formation of the current leakage path, barrier layer 126 can include an insulating material with a high dielectric constant of about 7 to about 20, a high electrical breakdown field of about 2 MV/cm to about 100 MV/cm, and/or a high material density of about 2.1 gm/cm$^3$ to about 4 gm/cm$^3$. In some embodiments, the insulating material can include SiN, SiC, $Si_xN_yO_x$, gallium nitride (GaN), tungsten oxide ($WO_x$), aluminum oxide ($Al_xO_y$), aluminum nitride (AlN), and any other suitable insulating material with the high dielectric constant, high electrical breakdown field, and/or high material density. In some embodiments, the insulating material of barrier layer 126 can be different from that of ILD layers 120. In some embodiments, the insulating material of barrier layer 126 can have a dielectric constant, an electrical breakdown field, and/or a material density higher than those of the insulating material of ILD layers 120.

In addition, barrier layer 126 can extend to a height H3 of about 3 nm to about 50 nm below top surfaces 122t of contact plugs 122B and can extend to a height H4 of about 3 nm to about 50 nm above top surfaces 122t of contact plugs 122B. In some embodiments, the portions of barrier layer 126 extending below top surfaces 122t can be in direct contact with sidewalls of contact structures 122 along XZ-planes, as shown in FIG. 1D, and may not be in contact with sidewalls of contact structures 122 along YZ-planes, as shown in FIG. 1C. In some embodiments, heights H3 can be equal to or greater than height H4 and may not be less than height H4. In some embodiments, height H3 can be equal to or greater than height H2 and may not be less than height H2. In other words, bottom surface 126b of barrier layer 126 can be at the same surface plane as or at a lower surface plane than the bottom surfaces of via-bases 124A. With such structural and material configurations of barrier layer 126, the formation of a metal leakage path through barrier layer 126 between adjacent via-bases 124A can be prevented, thus preventing the formation of the current leakage path. In some embodiments, heights H2, H3, and H4 can be less than height H1 and may not be equal to or greater than height H1.

In some embodiments, ILD layer 128 can be disposed on barrier layer 126 and can surround the portions of via structures 124 extending above top surface 126t of barrier layer 126. In some embodiments, a top surface of ILD layer 128 can be substantially coplanar with top surfaces of via structures 124.

Figure 1E:
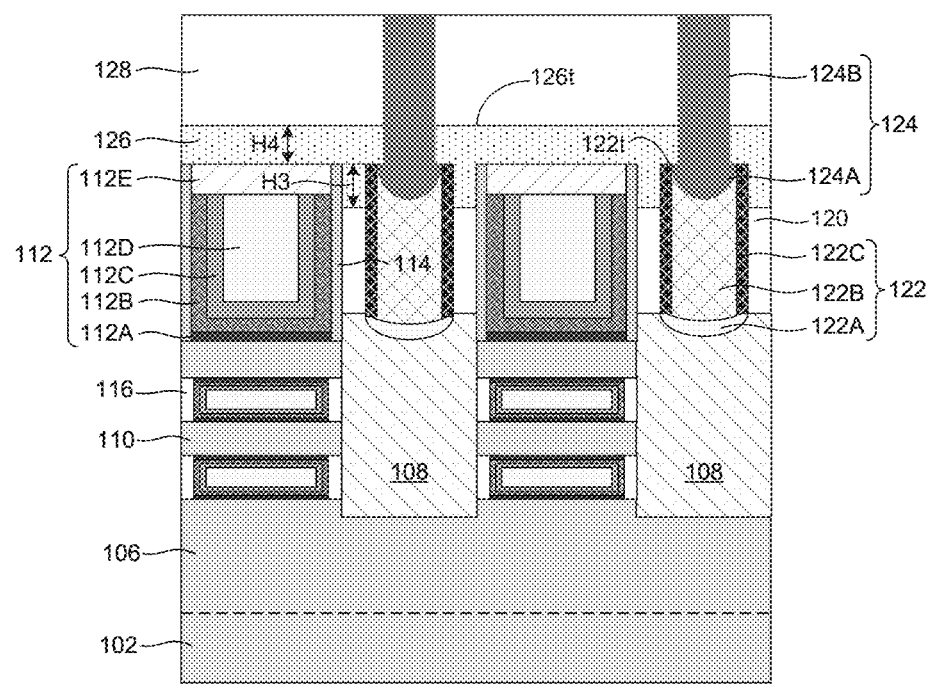

Referring to FIG. 1E, the discussion of the cross-sectional view of FIG. 1C applies to the cross-sectional view of FIG. 1E, unless mentioned otherwise. The discussion of elements in FIGS. 1A-1E with the same annotations applies to each other, unless mentioned otherwise. In some embodiments, unlike contacts structures 122 of FIG. 1C, contact structures 122 of FIG. 1E can be separated from outer gate spacers 114 by ILD layers 120 and the portions of barrier layer 126 extending below top surfaces 122t of contact plugs 122B. And, the portions of barrier layer 126 extending below top surfaces 122t can be in direct contact with the sidewalls of contact structures 122 along XZ-planes, as shown in FIG. 1D and can be direct in contact with the sidewalls of contact structures 122 along YZ-planes, as shown in FIG. 1E.

Figure 1F:
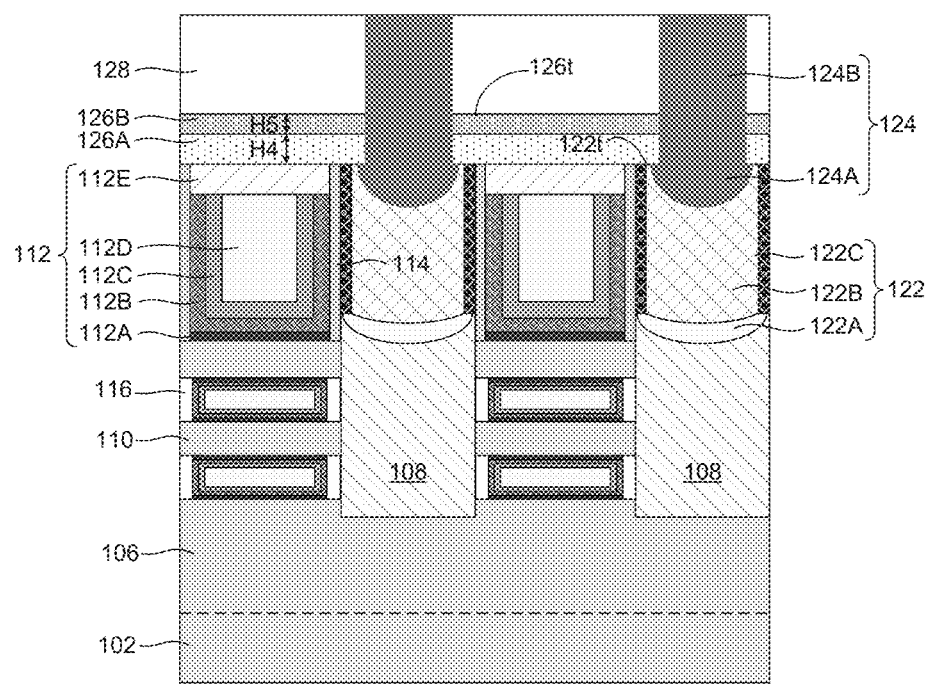
Figure 1G:
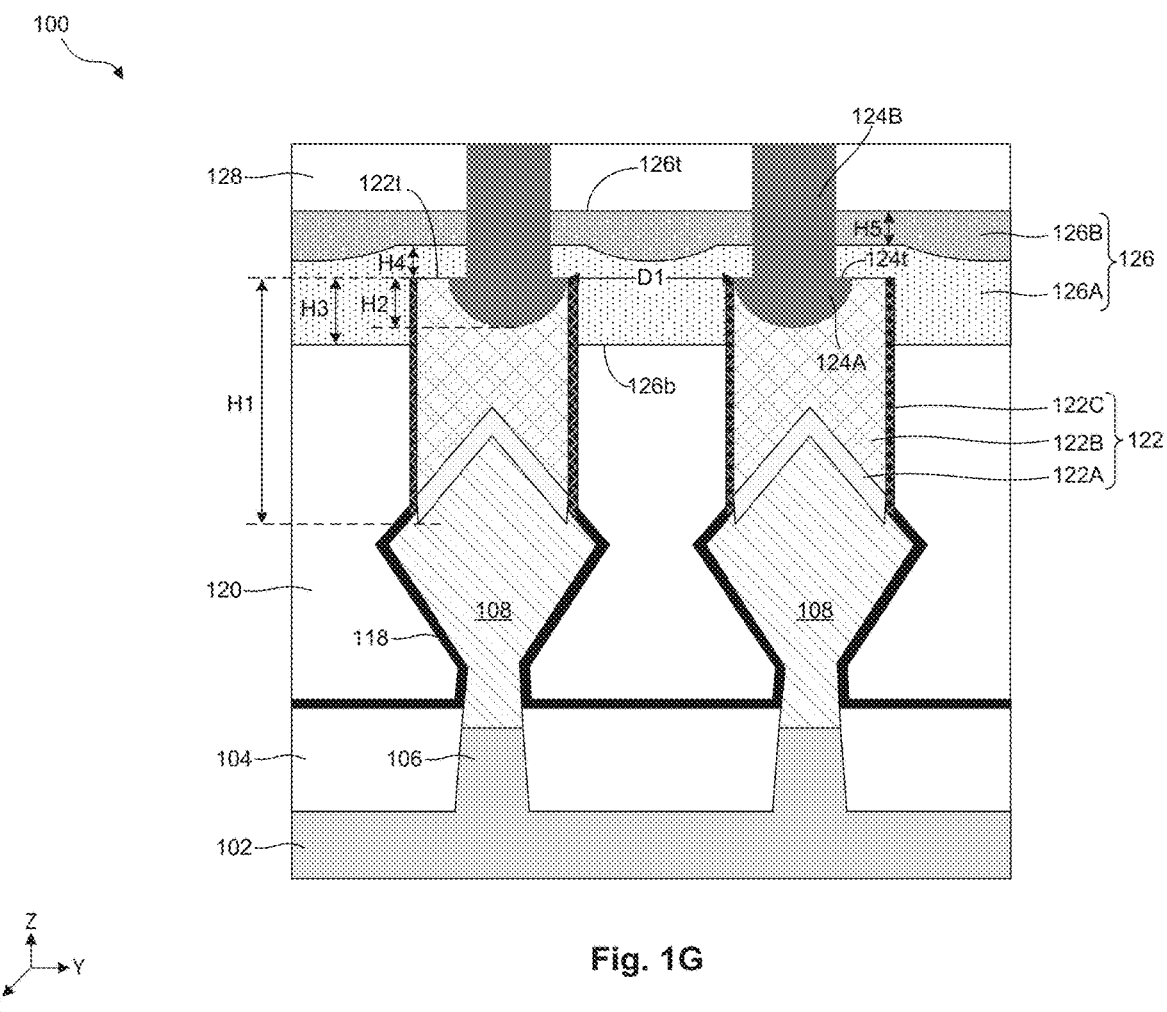

Referring to FIGS. 1F and 1G, the discussion of the cross-sectional view of FIGS. 1C and 1D applies to the cross-sectional view of FIGS. 1F and 1G, respectively, unless mentioned otherwise. The discussion of elements in FIGS. 1A-1G with the same annotations applies to each other, unless mentioned otherwise. In some embodiments, unlike barrier layer 126 of FIGS. 1C-1E, barrier layer 126 of FIGS. 1F-1G can include a first barrier layer 126A and a second barrier layer 126B. In some embodiments, barrier layer 126 includes at least two layers 126A and 126B. In some embodiments, layers 126A and 126B can have different insulating materials to give more flexibility of process and different device performances.

In some embodiments, a portion of first barrier layer 126A can be disposed on and in direct contact with gate structures 112, as shown in FIG. 1F, and another portion of first barrier layer 126A can be disposed on and in direct contact with ILD layers 120, as shown in FIG. 1G. And, first barrier layer 126A can be disposed between adjacent contact structures 122 and between adjacent via structures 124. In some embodiments, first barrier layer 126A can include an insulating material with a high dielectric constant of about 7 to about 20, a high electrical breakdown field of about 2 MV/cm to about 100 MV/cm, and/or a high material density of about 2.1 gm/cm$^3$ to about 4 gm/cm$^3$. In some embodiments, the insulating material can include SiN, SiC, $Si_xN_yO_x$, GaN, $WO_x$, $Al_xO_y$, AlN, and any other suitable insulating material with the high dielectric constant, high electrical breakdown field, and/or high material density. In some embodiments, the insulating material of first barrier layer 126A can be different from that of ILD layers 120. In some embodiments, the insulating material of first barrier layer 126A can have a dielectric constant, an electrical breakdown field, and/or a material density higher than those of the insulating material of ILD layers 120. In some embodiments, first barrier layer 126A can extend to a height H3 of about 3 nm to about 50 nm below top surfaces 122t of contact plugs 122B and can extend to a height H4 of about 3 nm to about 50 nm above top surfaces 122t of contact plugs 122B. In some embodiments, the portions of first barrier layer 126A extending below top surfaces 122t can be in direct contact with sidewalls of contact structures 122 along XZ-planes, as shown in FIG. 1D, and may not be in contact with sidewalls of contact structures 122 along YZ-planes, as shown in FIG. 1F. Bottom surface 126b of first barrier layer 126A can be at the same surface plane as or at a lower surface plane than the bottom surfaces of via-bases 124A.

In some embodiments, second barrier layer 126B can be disposed on and in direct contact with first barrier layer 126A. And, second barrier layer 126B can surround the portions of via structures 124 extending above the top surface of first barrier layer 126A. In some embodiments, second barrier layer 126B can function as an etch stop layer and can include an insulating material different from the insulating material of first barrier layer 126A. The insulating material of second barrier layer 126B can have a dielectric constant, an electrical breakdown field, and a material density lower than those of the insulating material of first barrier layer 126A. In some embodiments, second barrier layer 126B can include a nitride material with a nitrogen concentration lower than the nitrogen concentration in the nitride material of first barrier layer 126A. In some embodiments, second barrier layer 126B can include a carbide material with a carbon concentration lower than the carbon concentration in the carbide material of first barrier layer 126A. In some embodiments, first and second barrier layers 126A and 126B can have the same insulating material. In some embodiments, the portions of second barrier layer 126B overlapping contact structures 122 can have a height H5 of about 5 nm to about 10 nm. In some embodiments, height H5 can be equal to or different from heights H2, H3, and/or H4. In some embodiments, the interfaces between the portions of first and second barrier layers 126A and 126B overlapping contact structures 122 can have a substantially linear cross-sectional profile. And, the interfaces between the portions of first and second barrier layers 126A and 126B non-overlapping with contact structures 122 can have a curved cross-sectional profile.

Figure 1H:
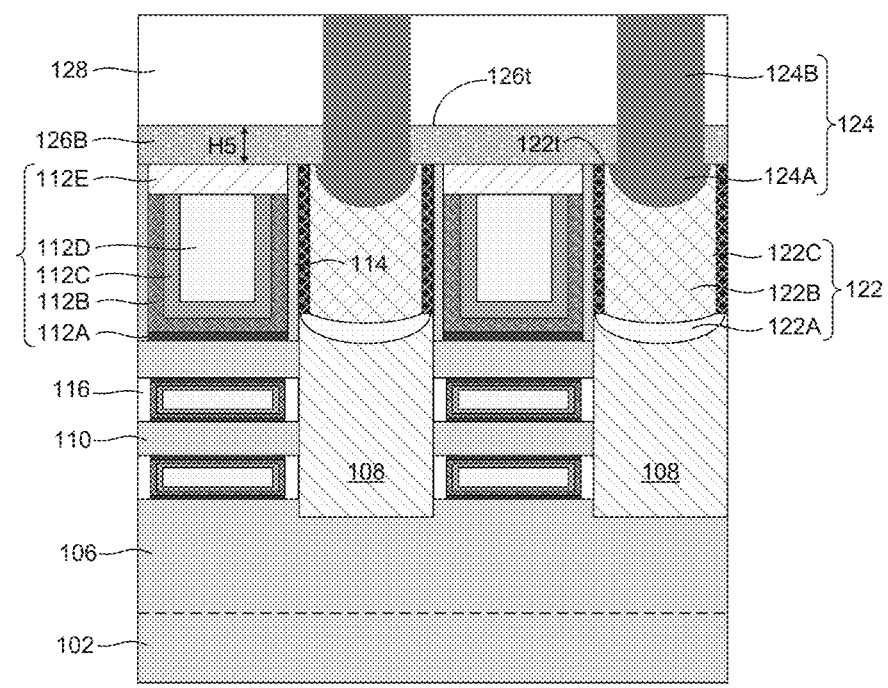
Figure 1I:
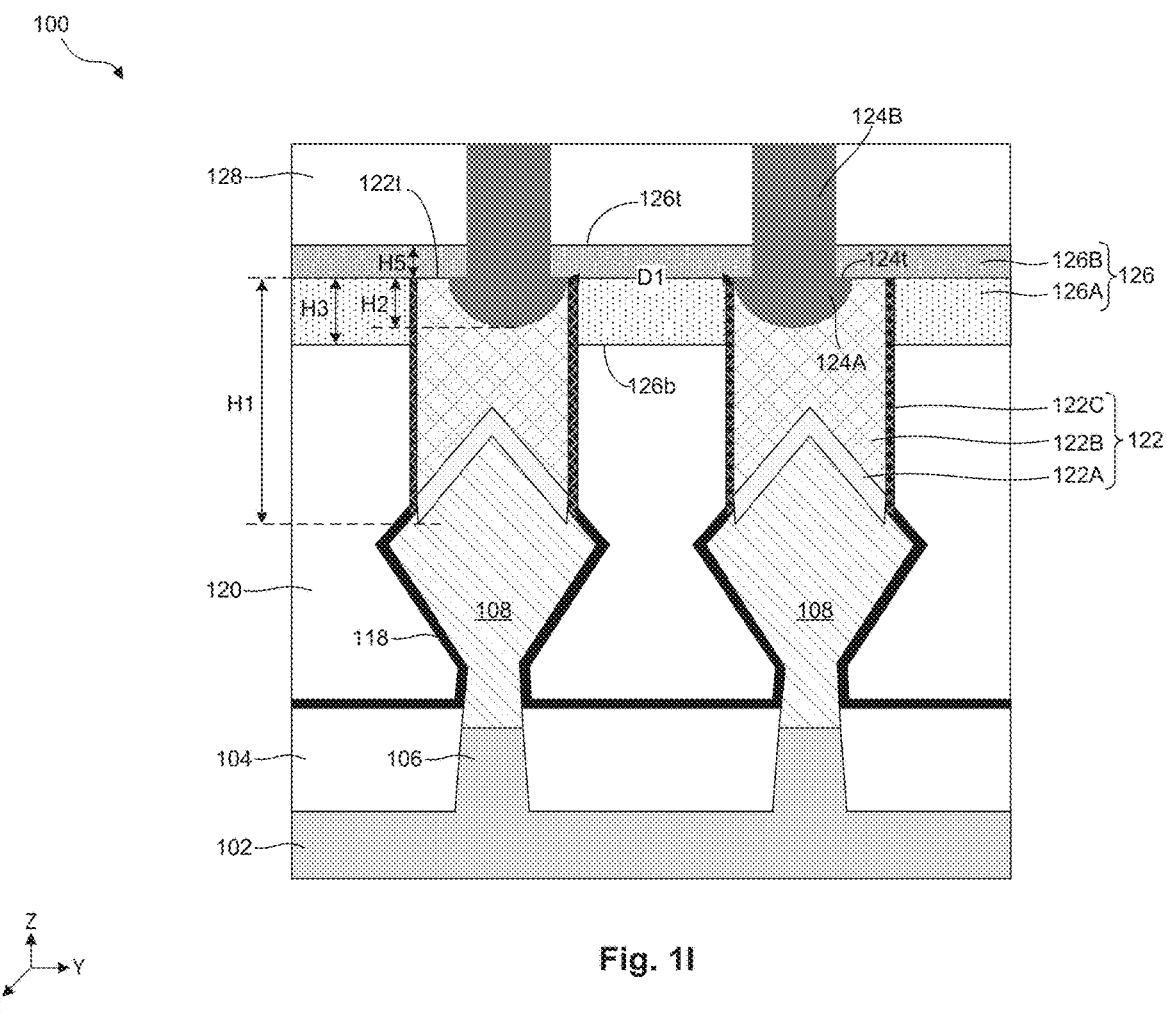

Referring to FIGS. 1H and 1I, the discussion of the cross-sectional view of FIGS. 1F and 1G applies to the cross-sectional view of FIGS. 1H and 1I, respectively, unless mentioned otherwise. The discussion of elements in FIGS. 1A-1I with the same annotations applies to each other, unless mentioned otherwise. In some embodiments, unlike first barrier layer 126A of FIGS. 1F-1G, the top surface of first barrier layer 126A of FIGS. 1H-1I can be substantially coplanar with top surfaces 122t of contact plugs 122B. In addition, unlike second barrier layer 126B of FIGS. 1F-1G, second barrier layer 126B of FIGS. 1H-1I can be disposed on and in direct contact with gate structures 112, contact structures 122, and first barrier layer 126A. In some embodiments, the interfaces between first and second barrier layers 126A and 126B can have a substantially linear cross-sectional profile, as shown in FIG. 1I.

Figure 2:
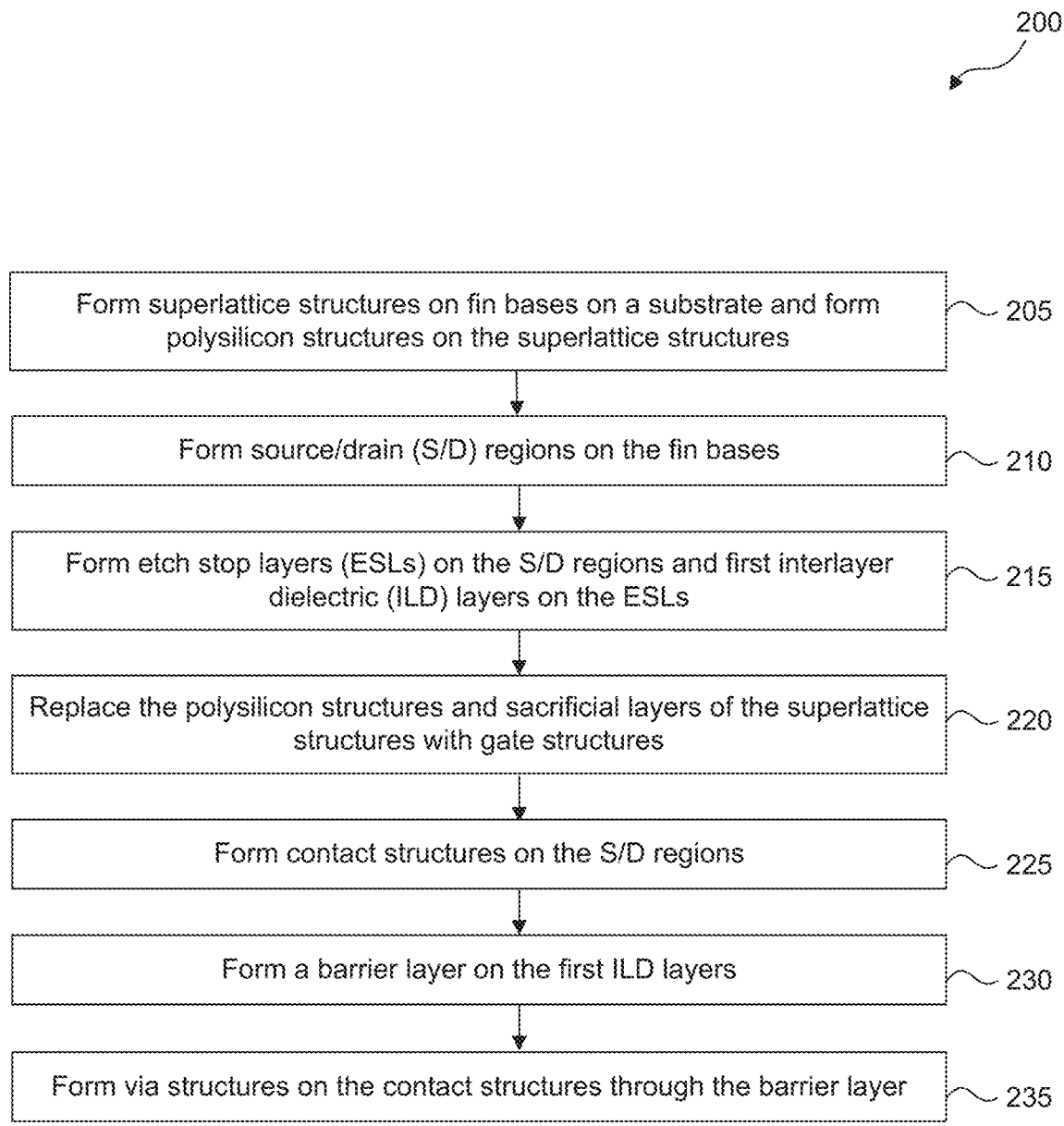
FIG. 2 is a flow diagram of a method for fabricating a semiconductor device with a barrier layer, in accordance with some embodiments.

FIG. 2 is a flow diagram of an example method 200 for fabricating FET 100, according to some embodiments. For illustrative purposes, the operations illustrated in FIG. 2 will be described with reference to the example fabrication process for fabricating FET 100 as illustrated in FIGS. 3A-18B. FIGS. 3A-18A are cross-sectional views of FET 100 along lines A-A of FIGS. 1A and 1B at various stages of fabrication, according to some embodiments. FIGS. 3B-18B are cross-sectional views of FET 100 along lines B-B of FIGS. 1A and 1B at various stages of fabrication, according to some embodiments. Operations can be performed in a different order or not performed depending on specific applications. It should be noted that method 200 may not produce a FET 100. Accordingly, it is understood that additional processes can be provided before, during, and after method 200, and that some other processes may only be briefly described herein. Elements in FIGS. 3A-18B with the same annotations as elements in FIGS. 1A-1I are described above.

Referring to FIG. 2, in operation 205, superlattice structures are formed on fin bases on a substrate and polysilicon structures are formed on the superlattice structures. For example, as described with reference to FIGS. 3A and 3B, superlattice structures 311 are formed on fin bases 106 on substrate 102 and polysilicon structures 312 are formed on superlattice structures 311. Superlattice structures 311 and polysilicon structures 312 are not visible in the cross-sectional view of FIG. 3B. In some embodiments, superlattice structure 311 can include epitaxially-grown nanostructured layers 110 and 310 arranged in an alternating configuration. In some embodiments, nanostructured layers 110 can include Si without any substantial amount of Ge (e.g., with no Ge) and nanostructured layers 310 can include SiGe. Nanostructured layers 310 are also referred to as sacrificial layers 310.

Figure 3A:
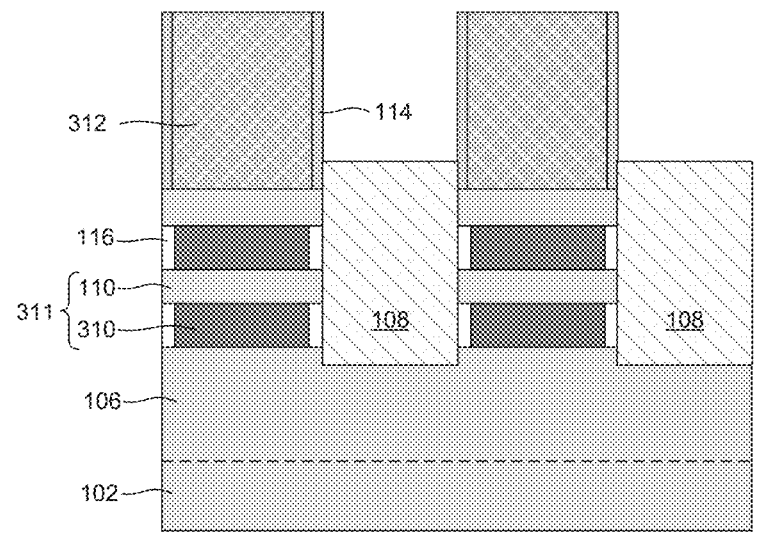
Figure 3B:
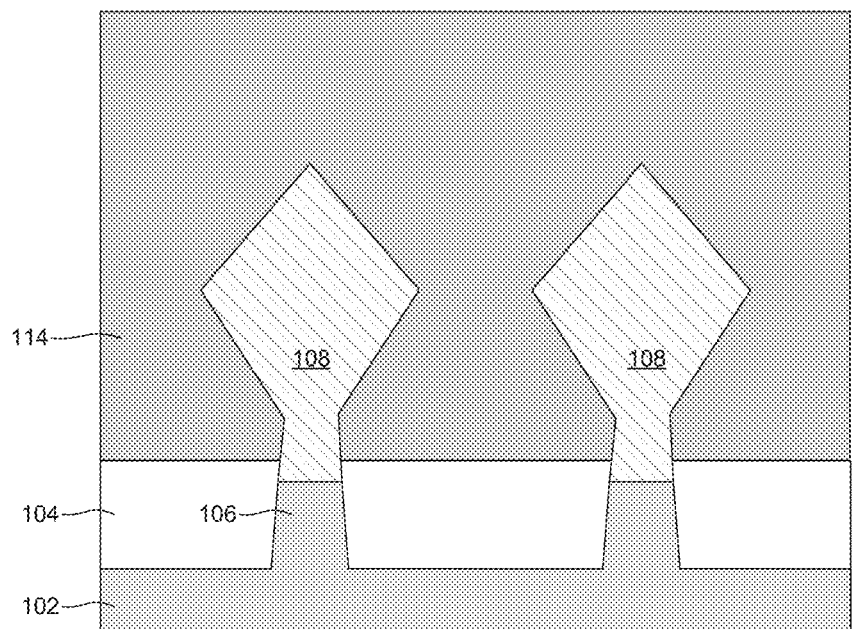
Figure 4A:
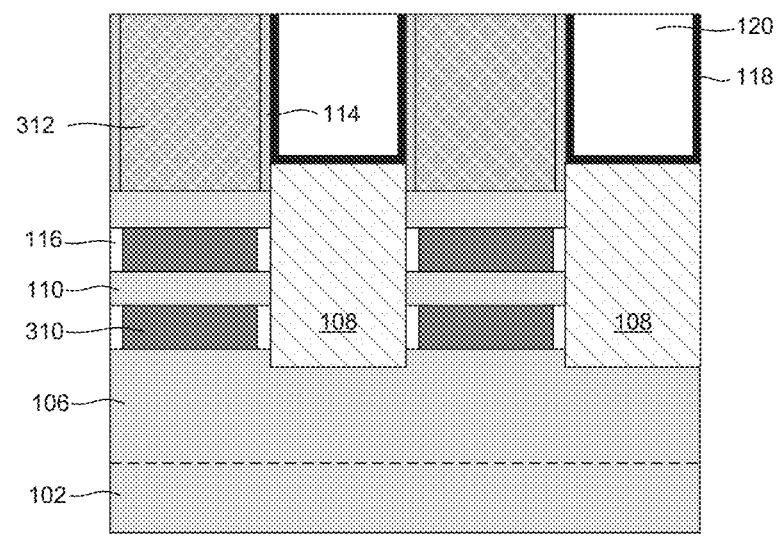
Figure 4B:
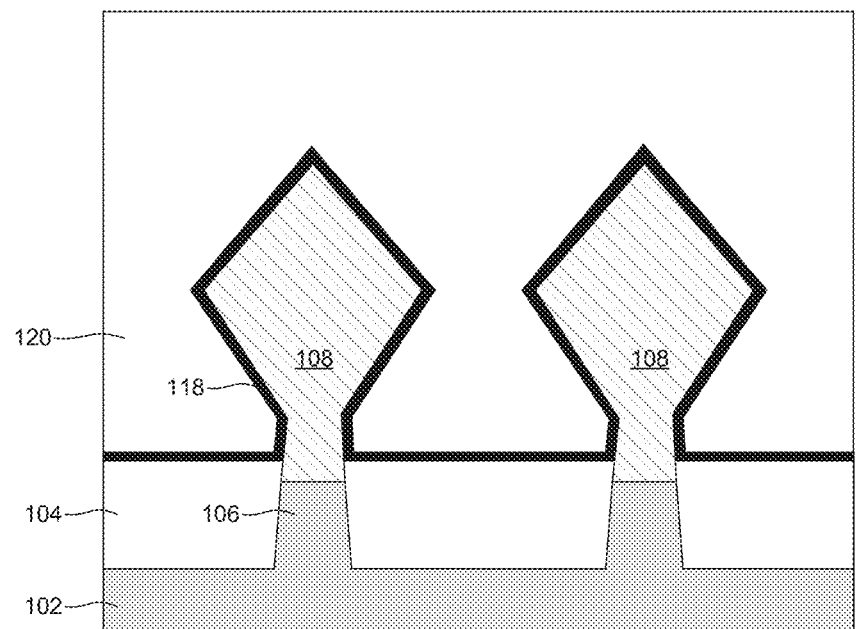

The formation of polysilicon structures 312 can include sequential operations of (i) depositing a polysilicon layer (not shown) on superlattice structures 311 and (iii) performing a patterning process (e.g., lithography process) on the polysilicon layer to form polysilicon structures 312, as shown in FIG. 3A. In some embodiments, outer gate spacers 114 can be formed after the formation of polysilicon structures 312. During subsequent processing, sacrificial layers 310 and polysilicon structures 312 can be replaced in a gate replacement process to form gate structures 112.

Referring to FIG. 2, in operation 210, S/D regions are formed on the fin bases. For example, as described with reference to FIGS. 3A and 3B, S/D regions 108 are formed on portions of fin bases 106 that are non-overlapping with polysilicon structures 312. The formation of S/D regions 108 can include forming S/D openings (not shown) on fin bases 106 and epitaxially growing semiconductor material on exposed portions of fin bases 106 in the S/D openings. In some embodiments, inner gate spacers 116 can be formed after the formation of S/D openings and prior to the epitaxial growth of the semiconductor material.

Referring to FIG. 2, in operation 215, ESLs are formed on the S/D regions and first ILD layers are formed on ESLs. For example, as described with reference to FIGS. 4A and 4B, ESLs 118 are formed on S/D regions 108 and ILD layers 120 are formed on ESLs 118. The formation of ESLs 118 and ILD layers 120 can include (i) depositing insulating layers (not shown) on the structures of FIGS. 3A and 3B, and (ii) performing a chemical mechanical polishing (CMP) process on the insulating layers to substantially coplanarize top surfaces of ESLs 118 and ILD layers 120 with top surfaces of polysilicon structures 312.

Figure 5A:
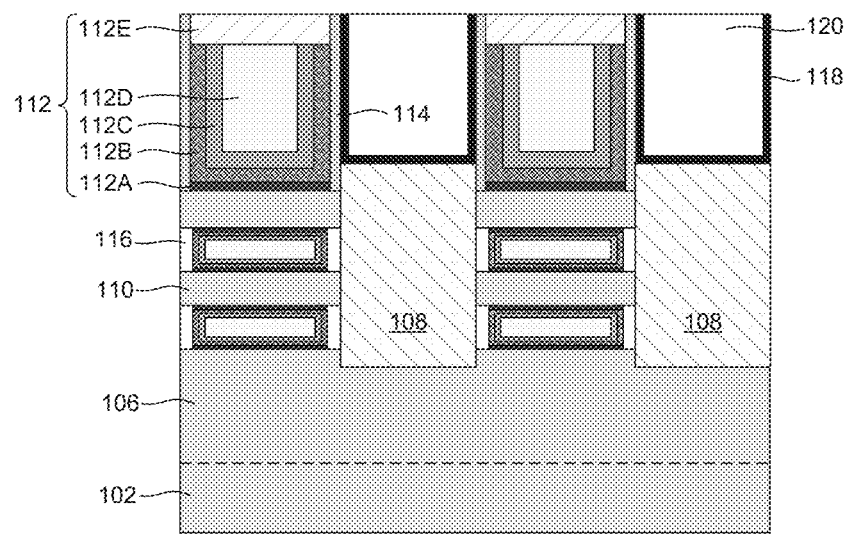
Figure 5B:
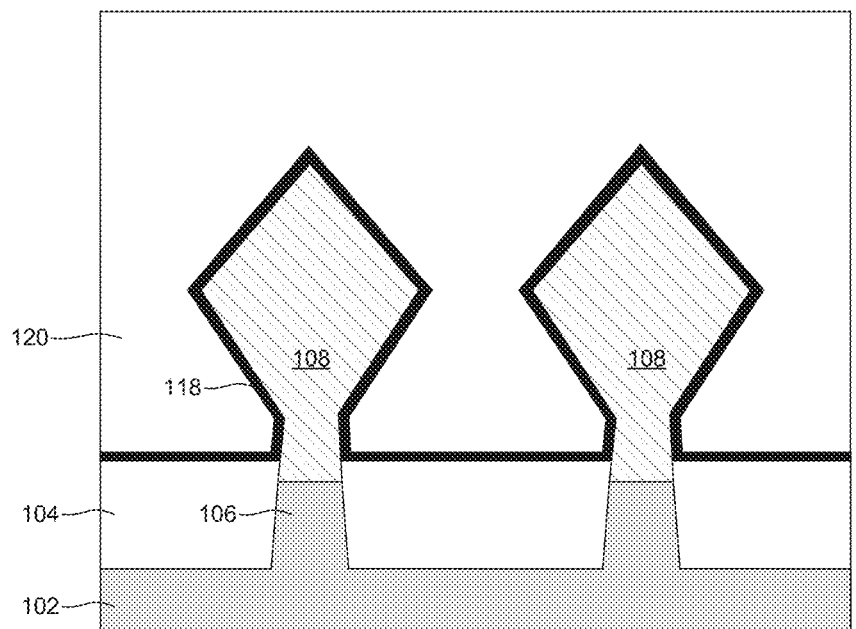
Figure 6A:
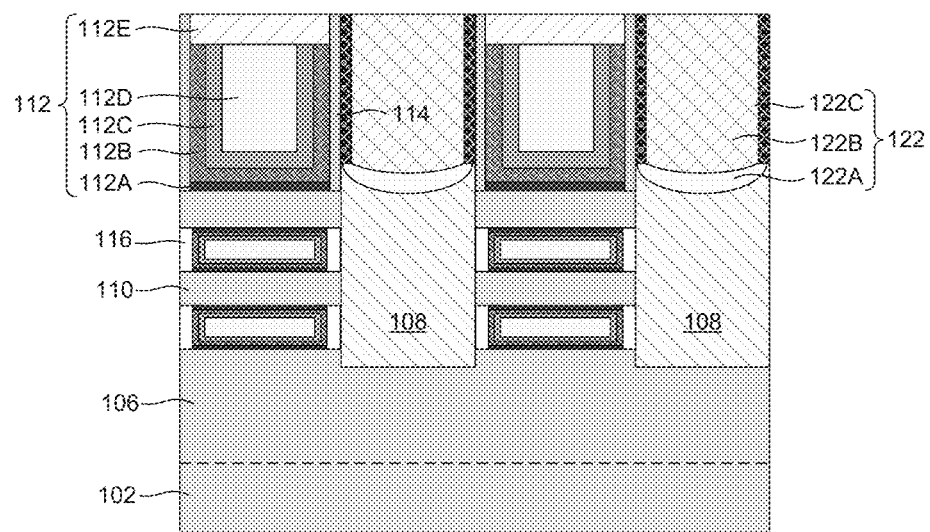
Figure 6B:
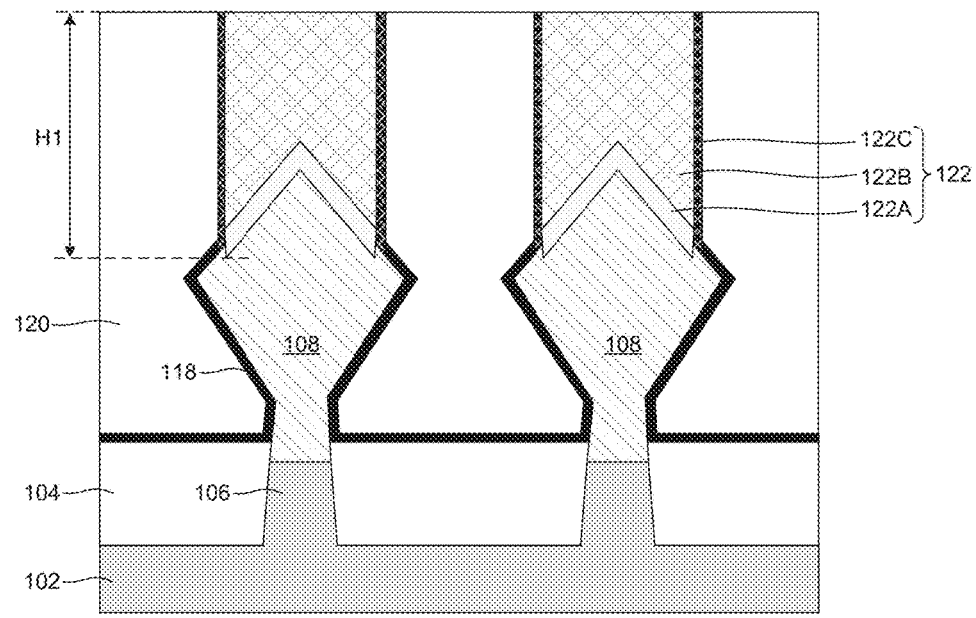

Referring to FIG. 2, in operation 220, polysilicon structures and sacrificial layers of the superlattice structures are replaced with gate structures. For examples, as described with reference to FIGS. 5A and 5B, polysilicon structures 312 and sacrificial layers 310 are replaced with gate structures 112. Gate structures 112 are not visible in the cross-sectional view of FIG. 5B. The replacement of polysilicon structures 312 and sacrificial layers 310 with gate structures 112 can include sequential operations of (i) etching polysilicon structures 312 from the structure of FIG. 4A, (ii) etching sacrificial layers 310 from the structure of FIG. 4A, (iii) forming IL layers 112A, as shown in FIG. 5A, by performing an oxidation process on the surfaces of nanostructured layers 110 exposed (not shown) after the etching of polysilicon structures 312 and sacrificial layers 310, (iv) depositing a dielectric layer (not shown) having the material of HK gate dielectric layer 112B on IL layers 112A, (v) depositing a conductive layer (not shown) having the material of WFM layers 112C on the dielectric layer, (vi) depositing a conductive fill layer (not shown) having the material of gate metal fill layers 112D on the conductive layer, (vii) performing a CMP process on the dielectric layer, the conductive layer, and the conductive fill layer to form HK gate dielectric layers 112B, WMF layers 112C, and gate metal fill layers 112D with their top surfaces substantially coplanarized (not shown) with top surfaces of ESLs 118 and ILD layers 120, (viii) etching HK gate dielectric layers 112B, WMF layers 112C, and gate metal fill layers 112D to form recesses (not shown), (ix) depositing a conductive layer (not shown) having the material of conductive capping layers 112E in the recesses and on ESLs 118 and ILD layers 120, and (x) performing a CMP process on the conductive layer to form the structure of FIG. 5A.

Referring to FIG. 2, in operation 225, contact structures are formed on the S/D regions. For example, as described with reference to FIGS. 6A and 6B, contact structures 122 are formed on S/D regions 108. The formation of contact structures 122 can include sequential operations of (i) removing portions of ESLs and ILD layers 120 on S/D regions 108 to form contact openings (not shown) on S/D regions 108, (ii) forming contact liners 122B in the contact openings, (iii) forming silicide layers 122A on the exposed surfaces of S/D regions 108 in the contact openings, and (iv) forming contact plugs 122C in the contact openings.

Figure 7A:
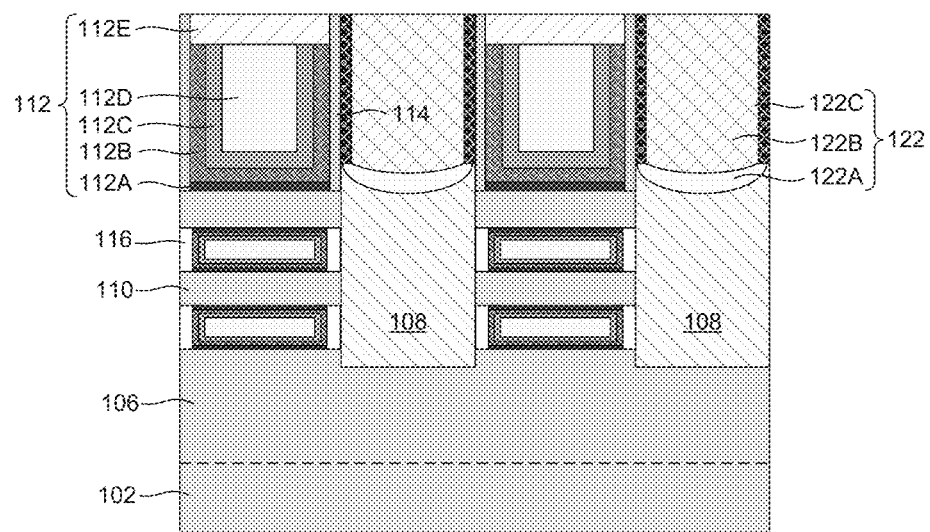
Figure 7B:
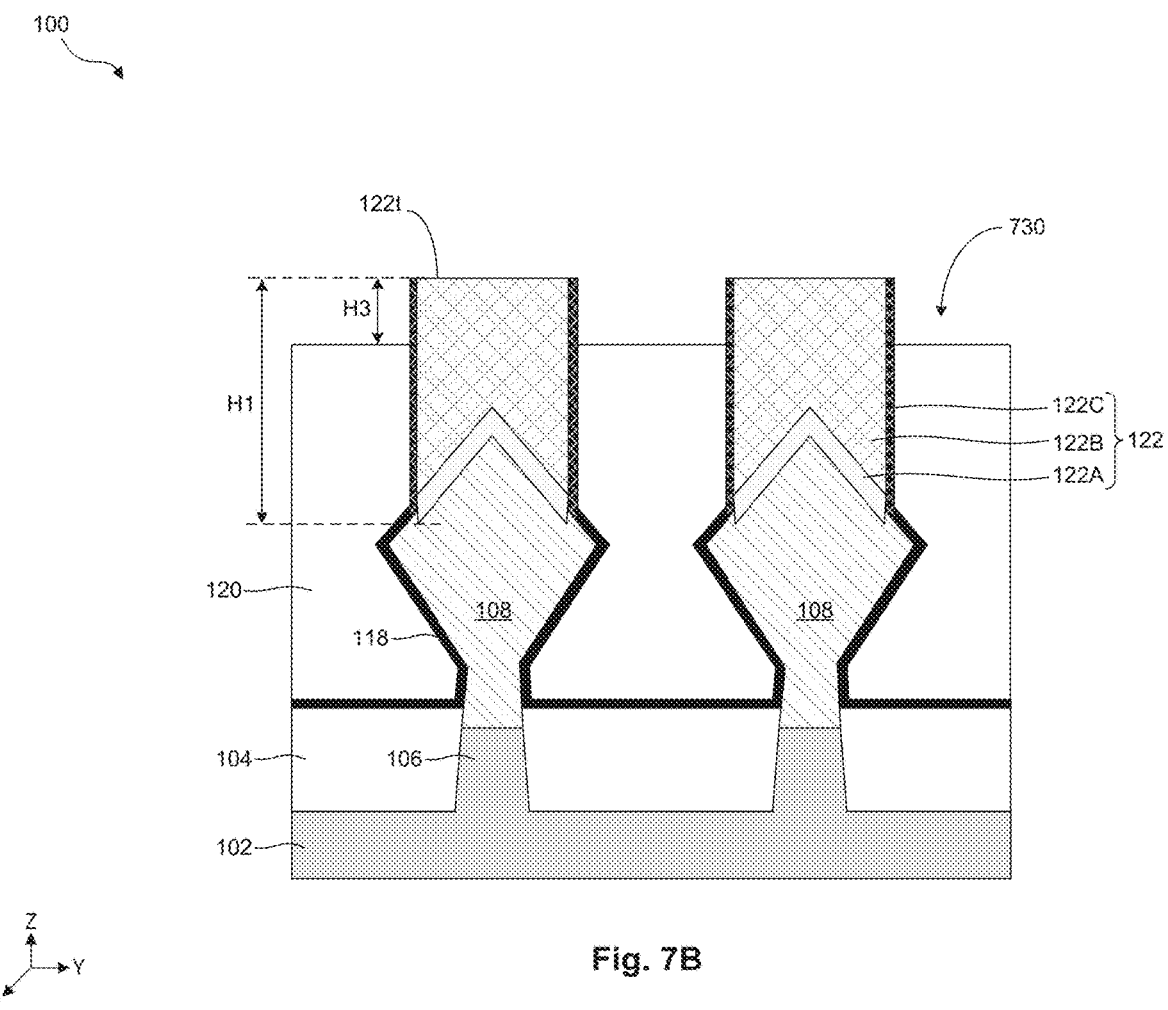
Figure 8A:
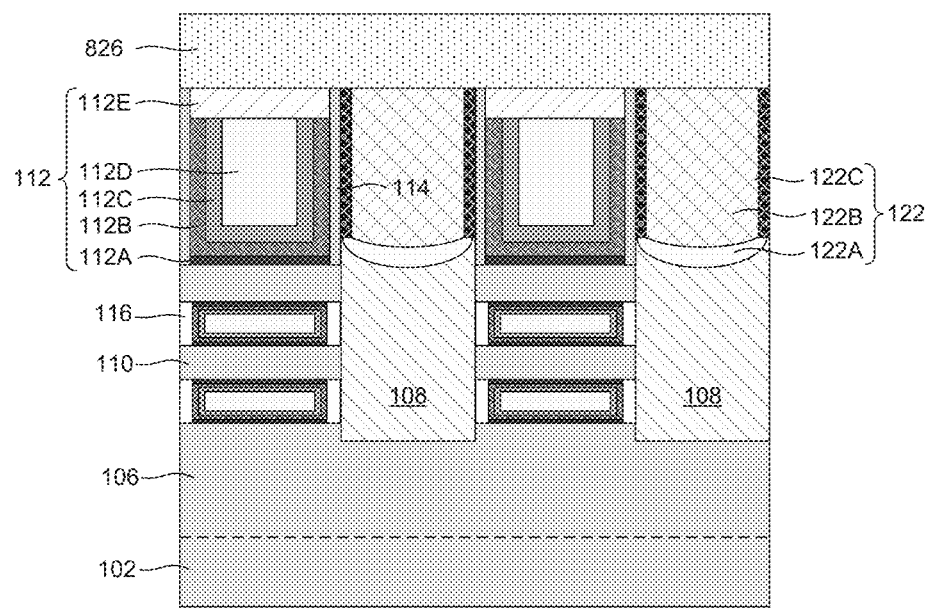
Figure 8B:
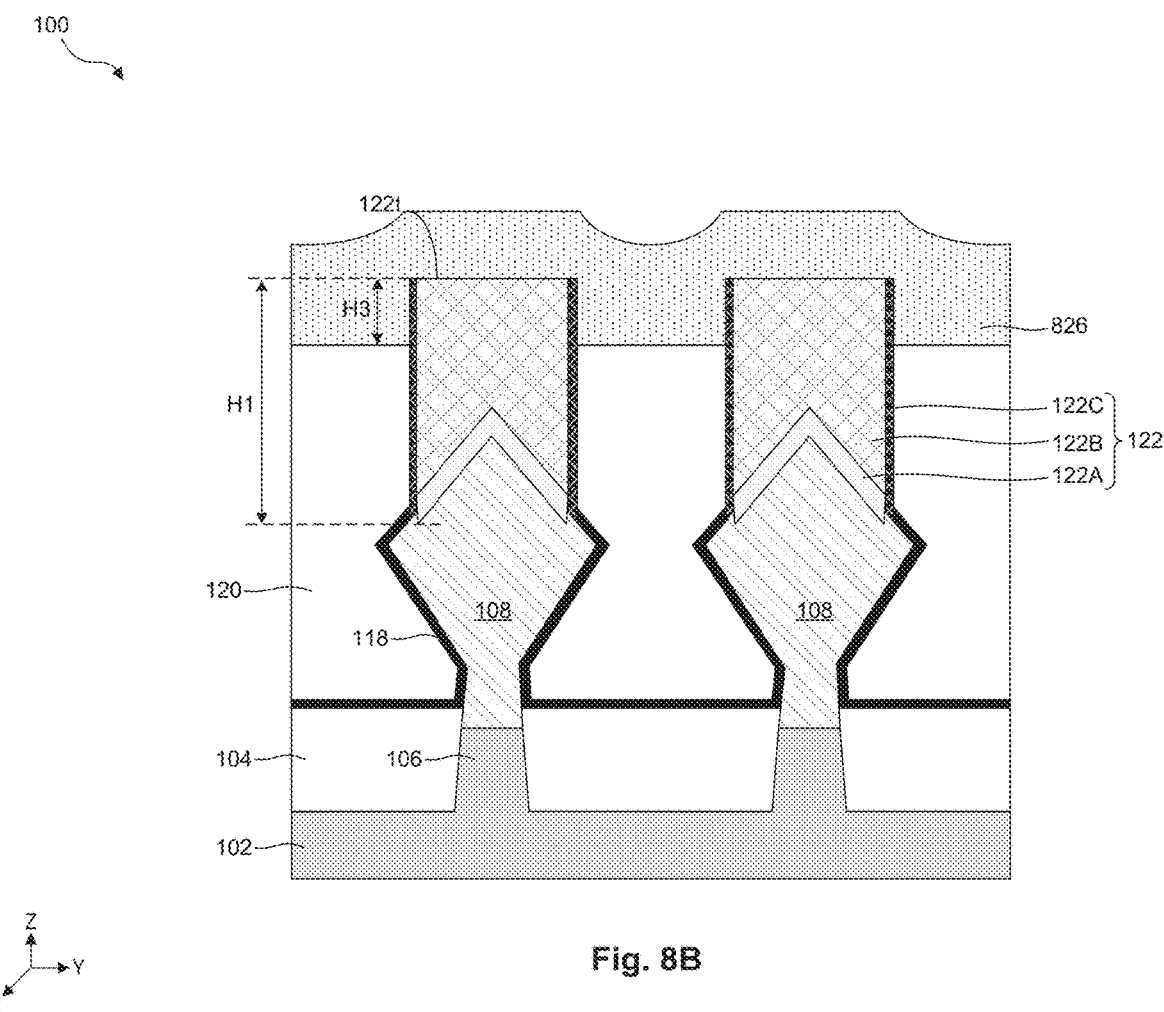
Figure 9A:
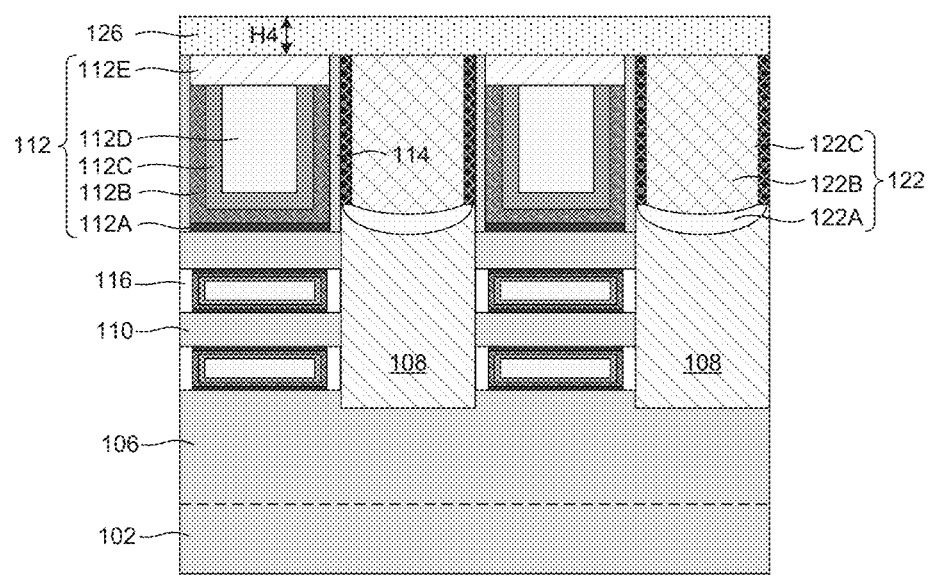
Figure 9B:
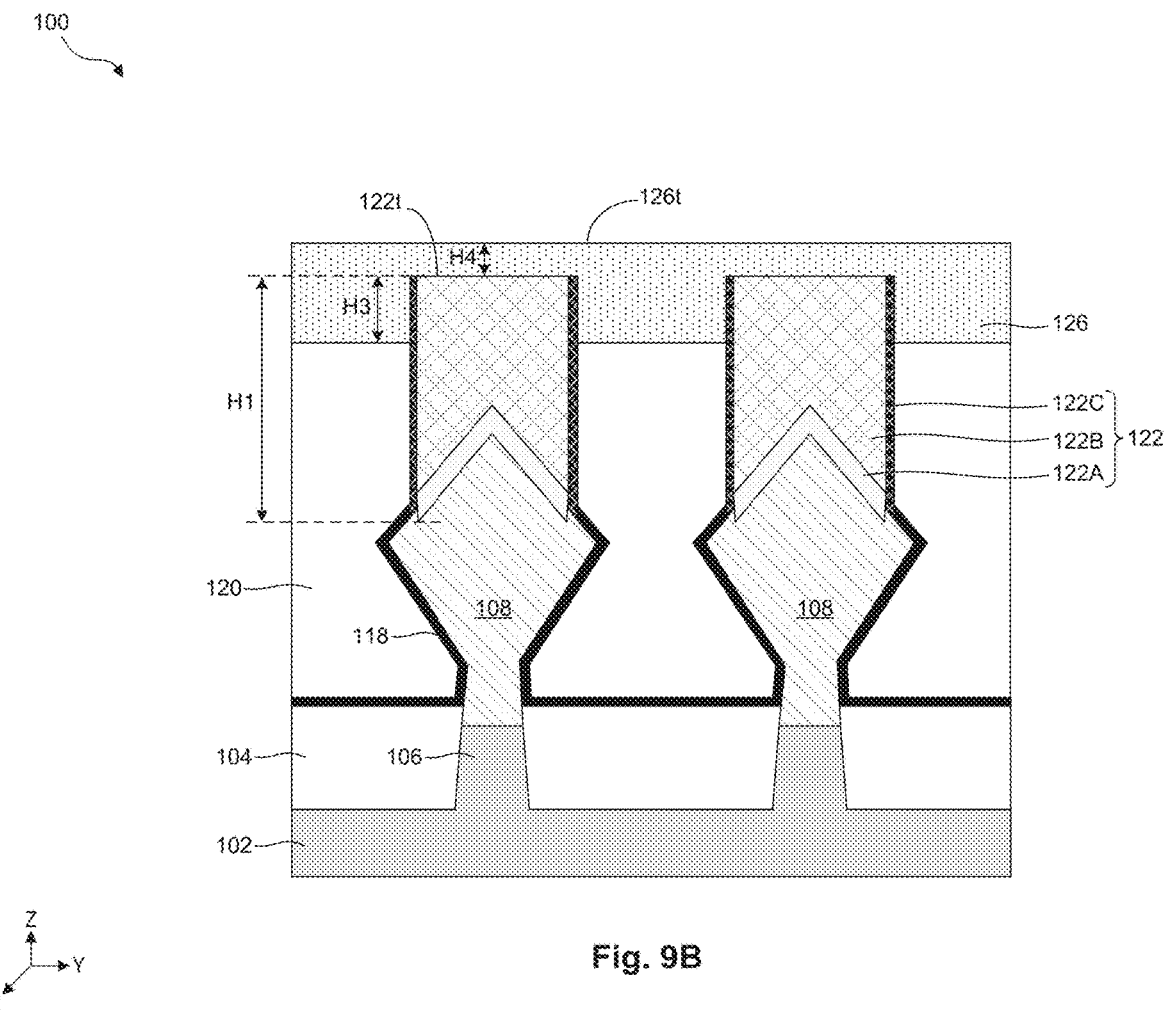
Figure 16A:
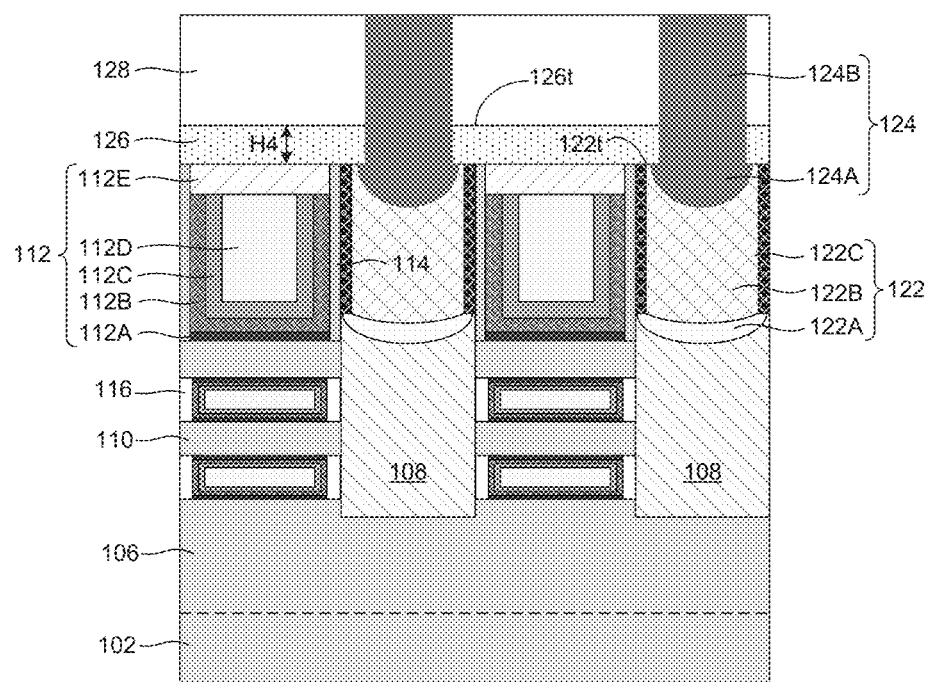
Figure 16B:
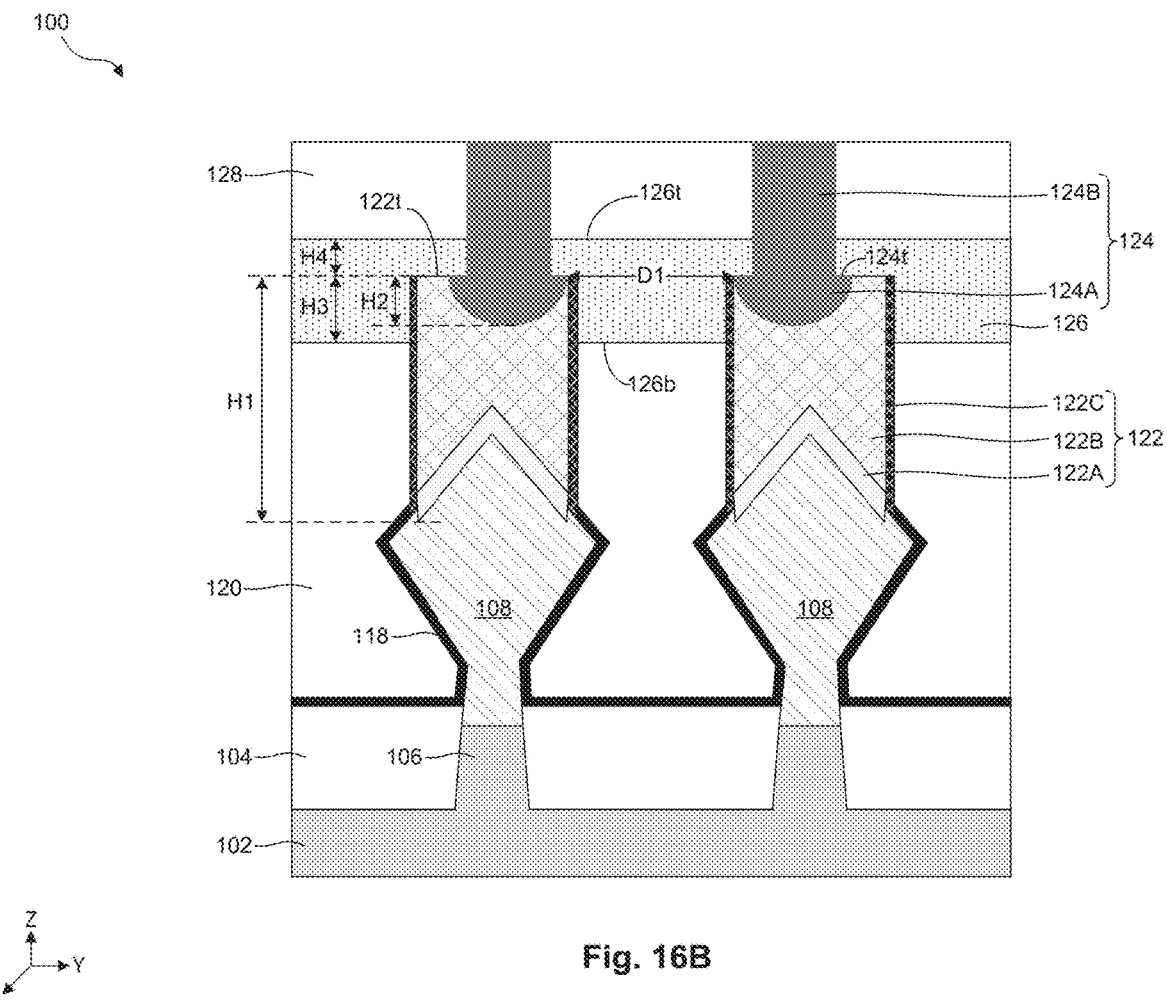

Referring to FIG. 2, in operation 230, a barrier layer is formed on the first ILD layers. For example, as described with reference to FIGS. 7A-7B, 8A-8B, and 9A-9B, barrier layer 126 of FIGS. 1C and 1D is formed on ILD layers 120. ILD layers 120 are not visible in the cross-sectional views of FIGS. 7A and 8A. The formation of barrier layer 126 of FIGS. 1C and 1D can include sequential operations of (i) performing a dry etch process on the structures of FIGS. 6A and 6B to remove portions of ILD layers 120 and form recesses 730 with a height of H3 that exposes the sidewalls of contact structures 124 along YZ-planes, as shown in FIG. 7B, (ii) depositing an insulating layer 826 having the material of barrier layer 126 on the structures of FIGS. 7A and 7B to fill recesses 730 and cover gate structures 112, outer gate spacers 114, and contact structures 122, as shown in FIGS. 8A and 8B, and (iii) performing a CMP process on insulating layer 826 to form barrier layer 126 with a substantially planar top surface 126t and an extended portion of height H4 above top surfaces 122t of contact structures 122, as shown in FIGS. 9A and 9B. In some embodiments, the top surface portions of insulating layer 826 overlapping contact structures 122 can have a substantially linear cross-sectional profile and the top surface portions of insulating layer 826 overlapping ILD layers 120 can have a curved cross-sectional profile, as shown in FIG. 8B. The formation of barrier layer 126 can be followed by the deposition of ILD layer 128 on barrier layer 126, as shown in FIGS. 16A and 16B.

Figure 10A:
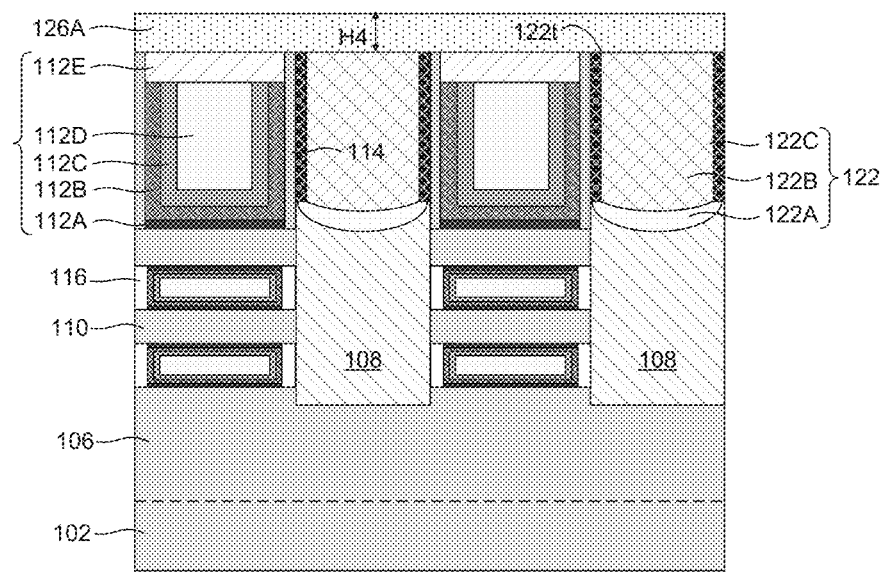
Figure 10B:
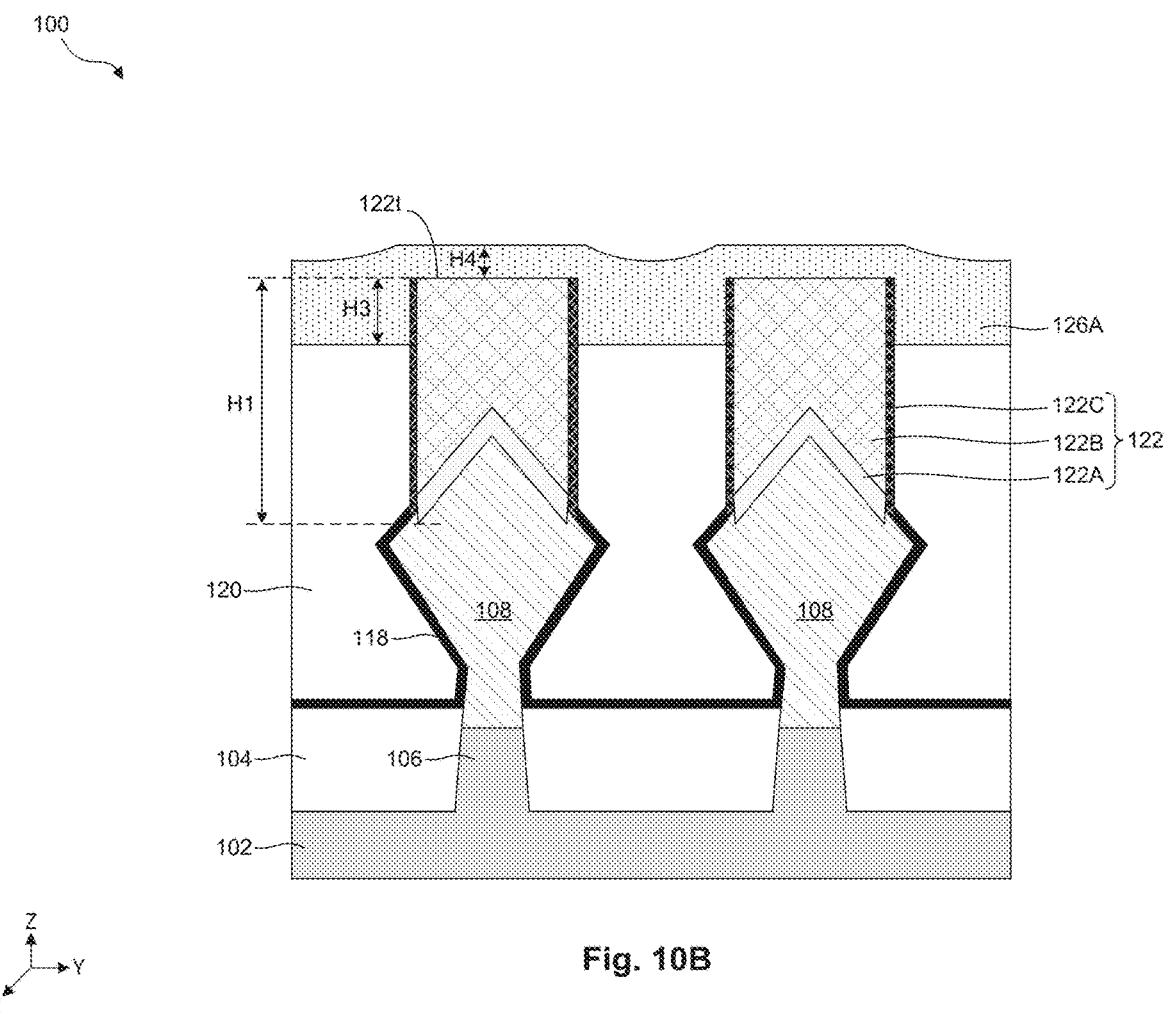
Figure 11A:
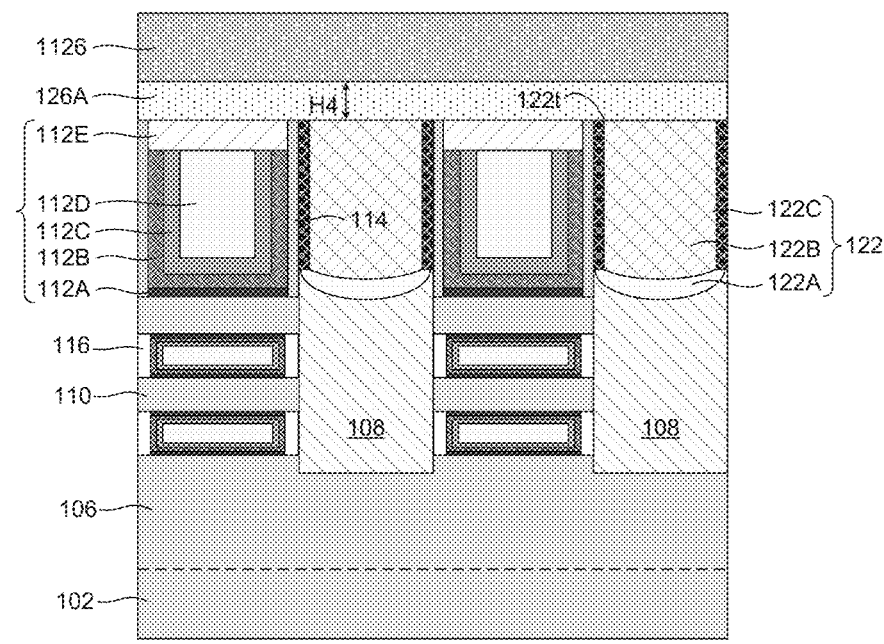
Figure 11B:
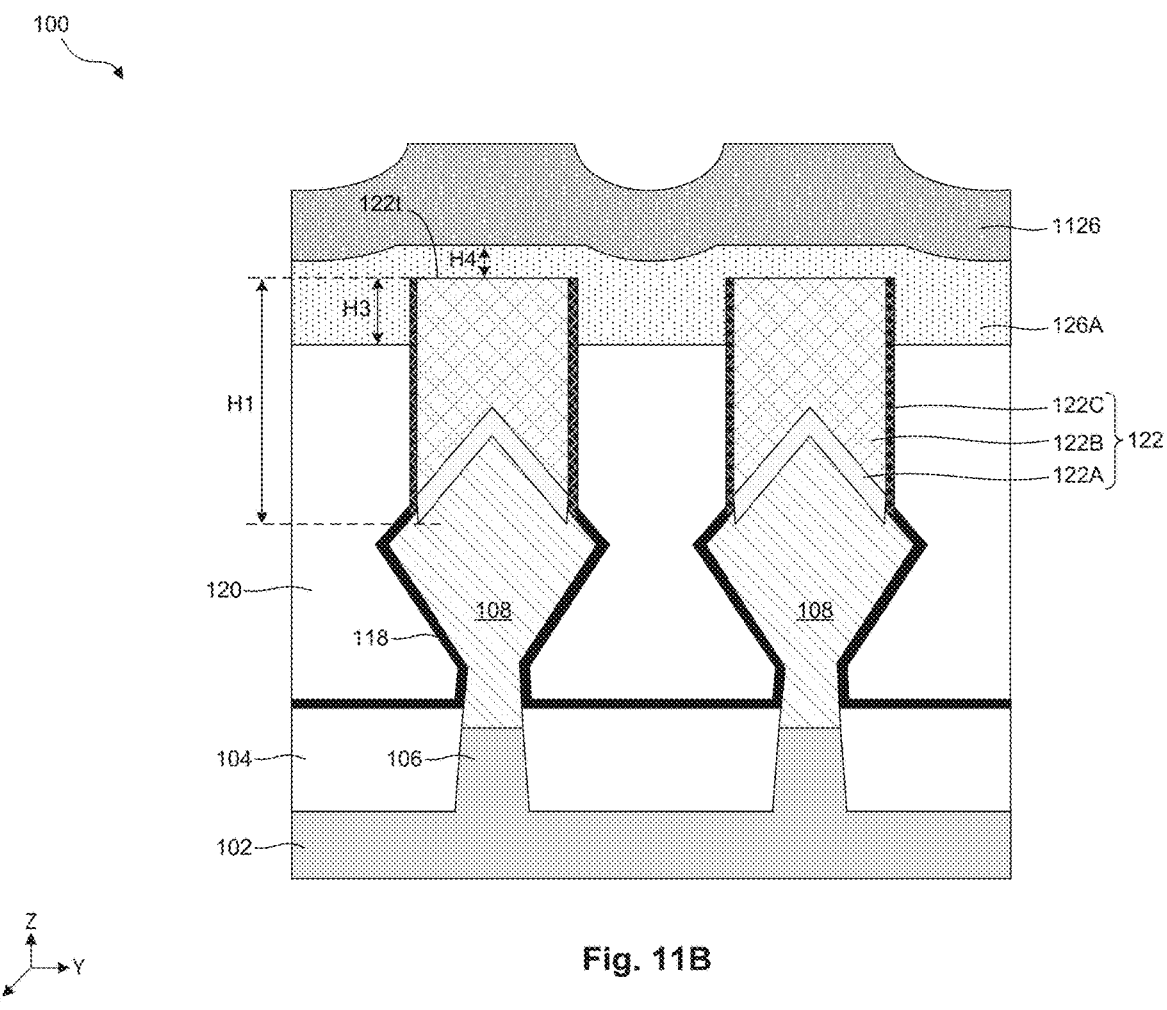
Figure 12A:
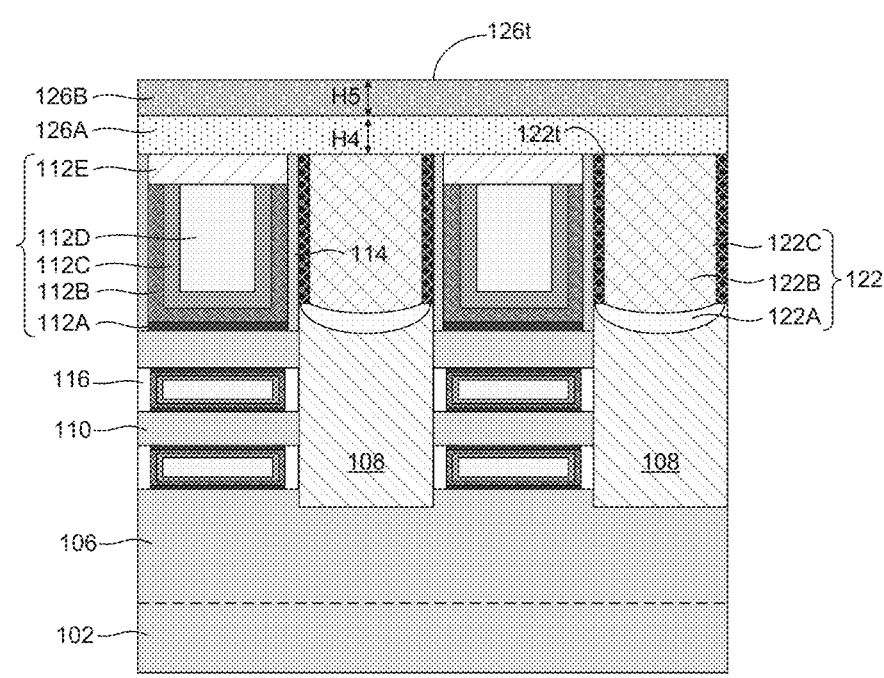
Figure 12B:
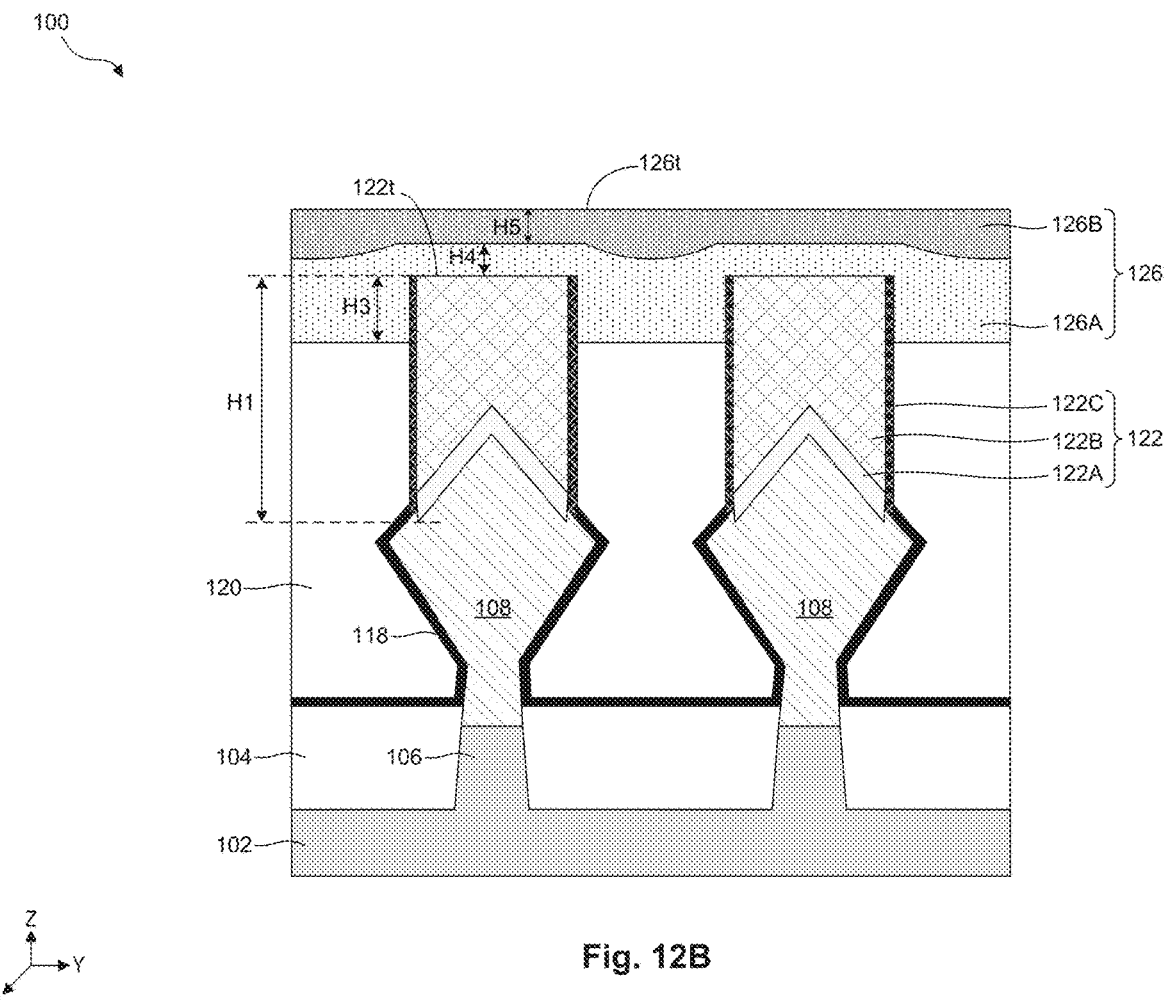
Figure 17A:
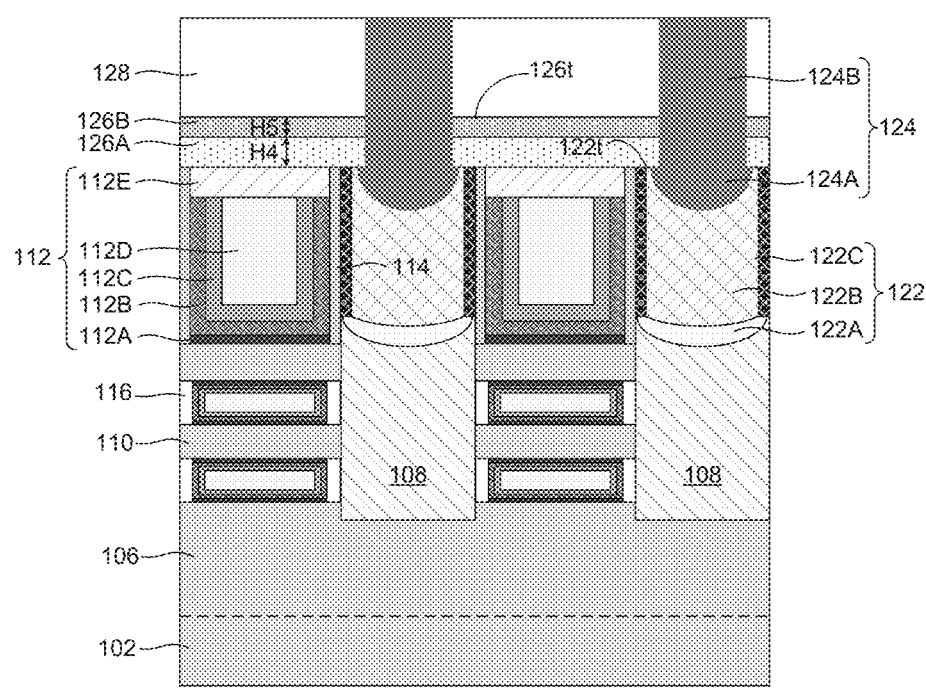
Figure 17B:
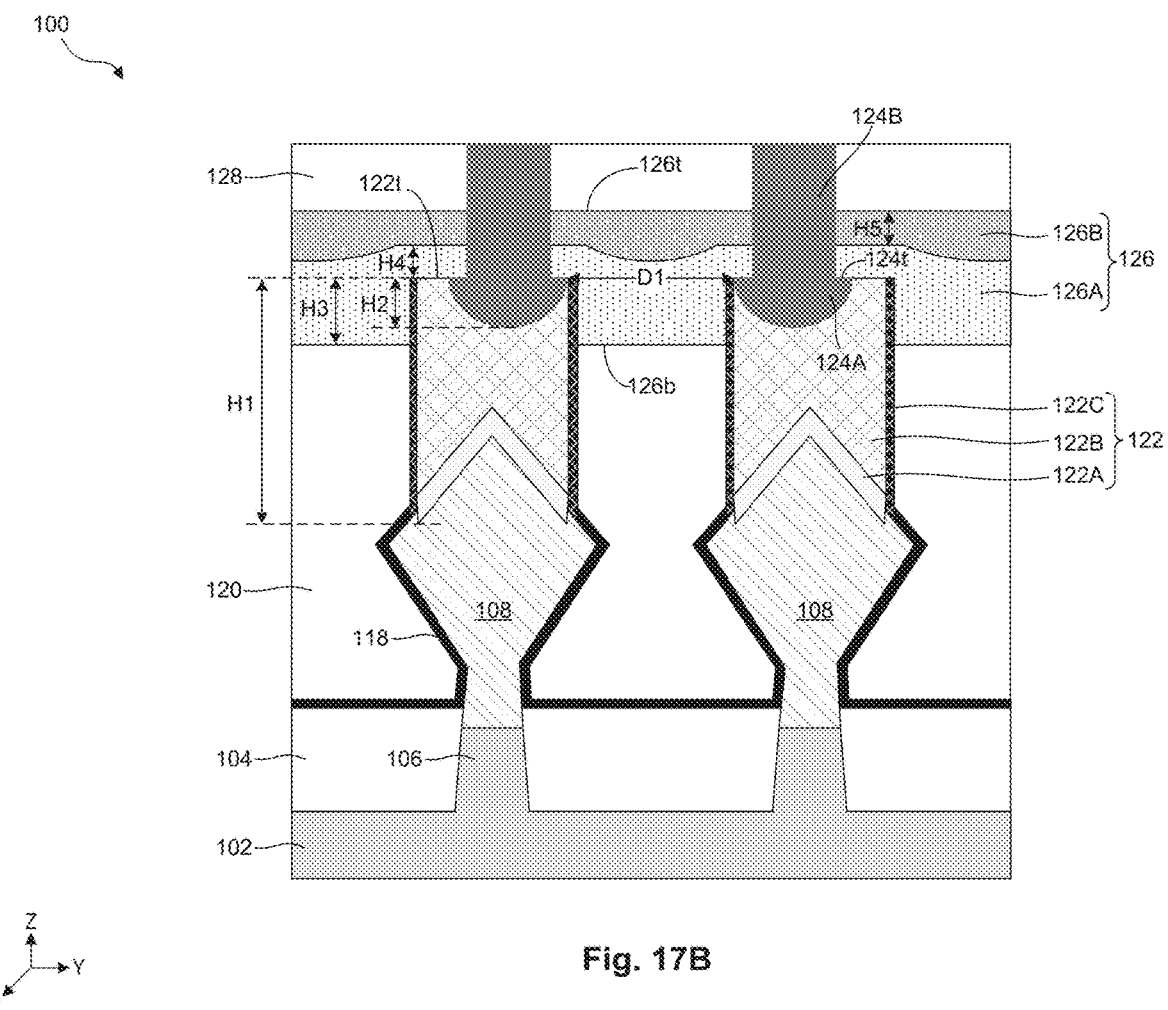

In some embodiments, as described with reference to FIGS. 7A-7B, 10A-10B, 11A-11B, and 12A-12B, barrier layer 126 of FIGS. 1F and 1G is formed on ILD layers 120. ILD layers 120 are not visible in the cross-sectional views of FIGS. 7A, 10A, 11A, and 12A. The formation of barrier layer 126 of FIGS. 1F and 1G can include sequential operations of (i) performing a dry etch process on the structures of FIGS. 6A and 6B to remove portions of ILD layers 120 and form recesses 730 with a height of H3 that exposes the sidewalls of contact structures 124 along YZ-planes, as shown in FIG. 7B, (ii) depositing first barrier layer 126A on the structures of FIGS. 7A and 7B to fill recesses 730 and cover gate structures 112, outer gate spacers 114, and contact structures 122, as shown in FIGS. 10A and 10B, (iii) depositing an insulating layer 1126 having the material of second barrier layer 126A on first barrier layer 126A, as shown in FIGS. 11A and 11B, and (iv) performing a CMP process on insulating layer 1126 to form second barrier layer 126B with height H5 and with a substantially planar top surface 126t, as shown in FIGS. 12A and 12B. In some embodiments, the top surface portions of first barrier layer 126A overlapping contact structures 122 can have a substantially linear cross-sectional profile and the top surface portions of first barrier layer 126A overlapping ILD layers 120 can have a curved cross-sectional profile, as shown in FIG. 10B. In some embodiments, the top surface portions of insulating layer 1126 overlapping contact structures 122 can have a substantially linear cross-sectional profile and the top surface portions of insulating layer 1126 overlapping ILD layers 120 can have a curved cross-sectional profile, as shown in FIG. 11B. The formation of barrier layer 126 can be followed by the deposition of ILD layer 128 on barrier layer 126, as shown in FIGS. 17A and 17B.

Figure 13A:
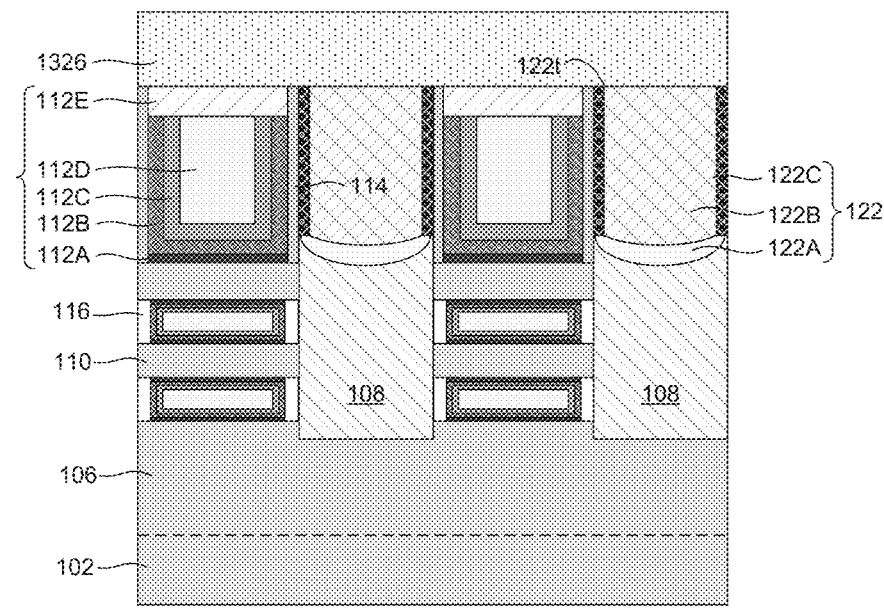
Figure 13A:
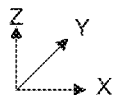
Figure 13B:
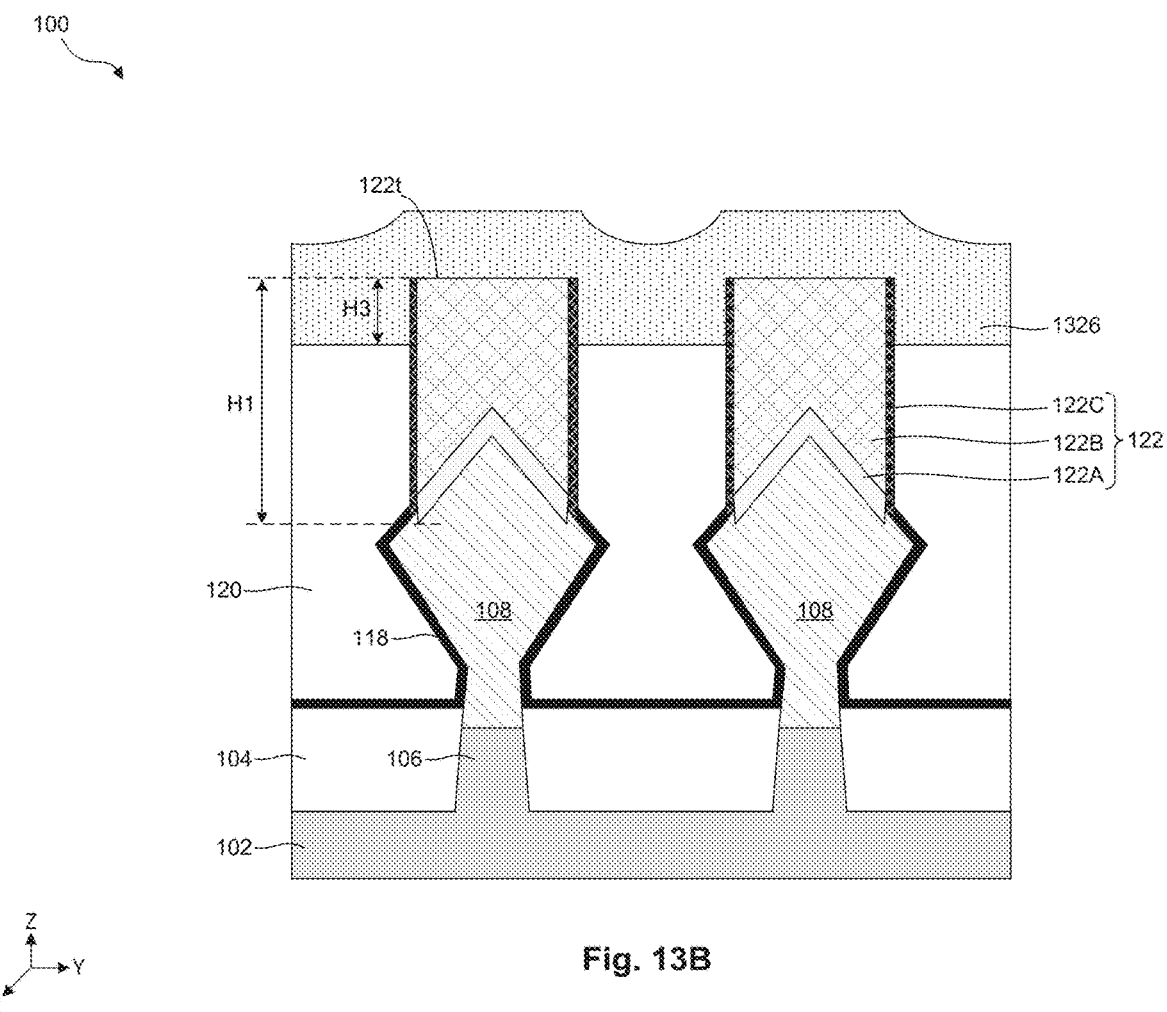
Figure 14A:
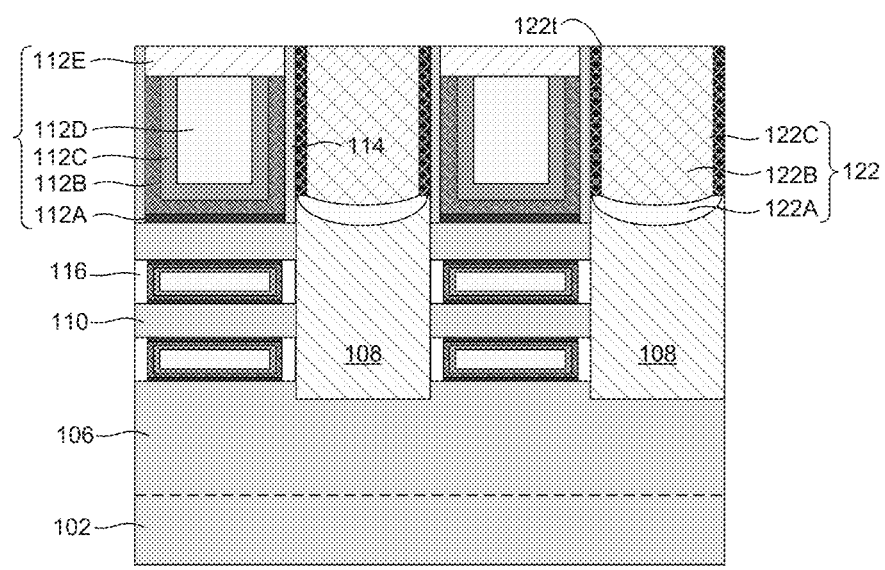
Figure 14B:
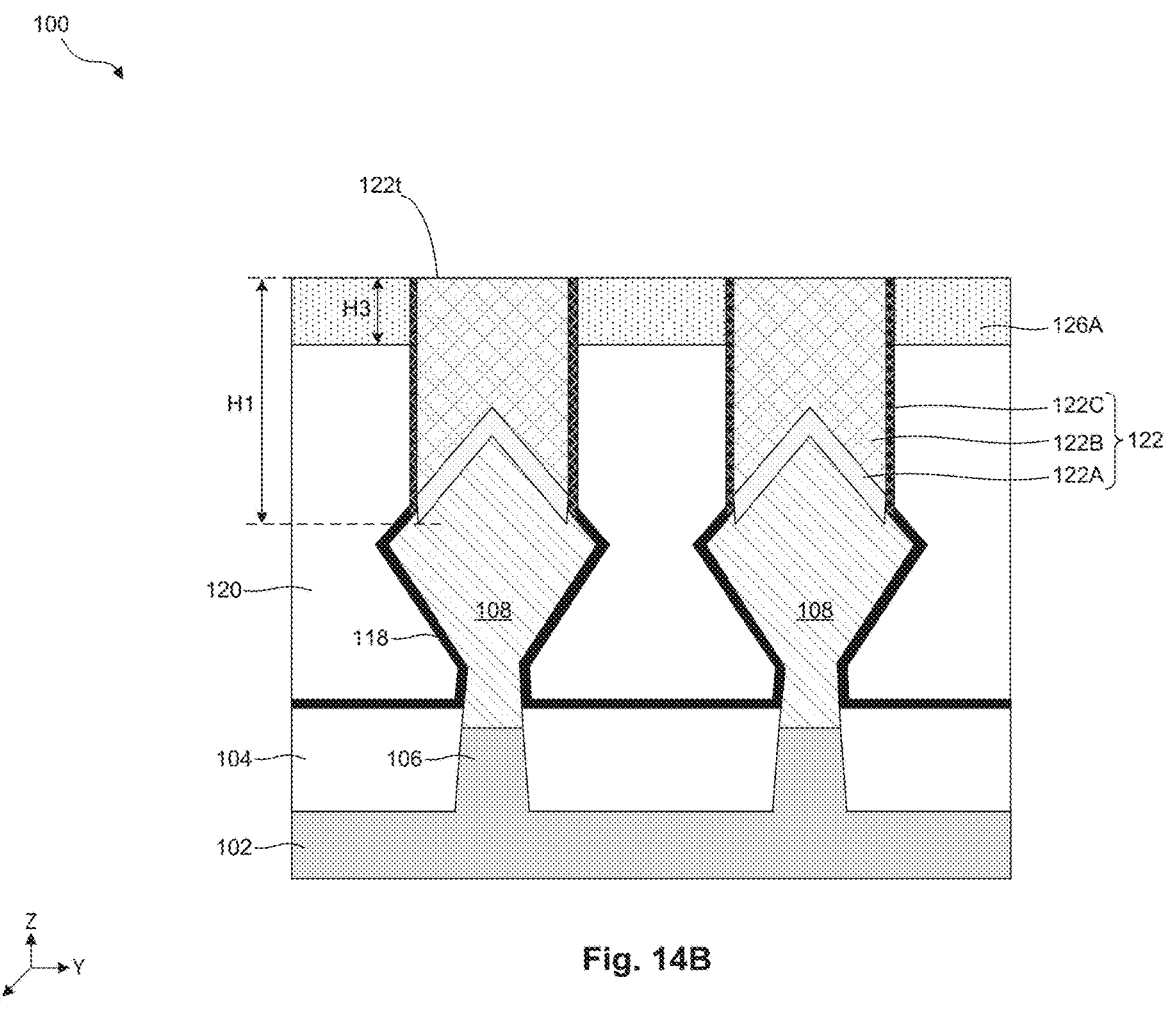
Figure 15A:
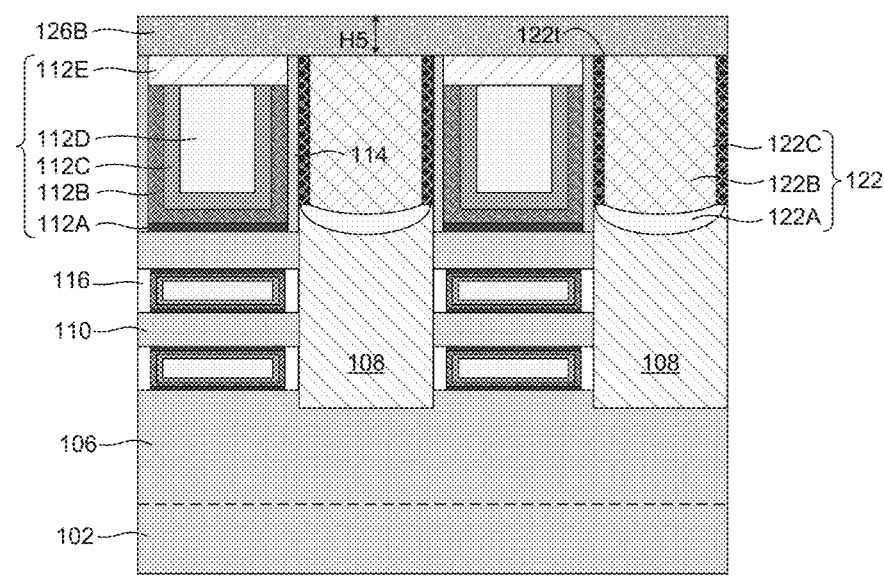
Figure 15B:
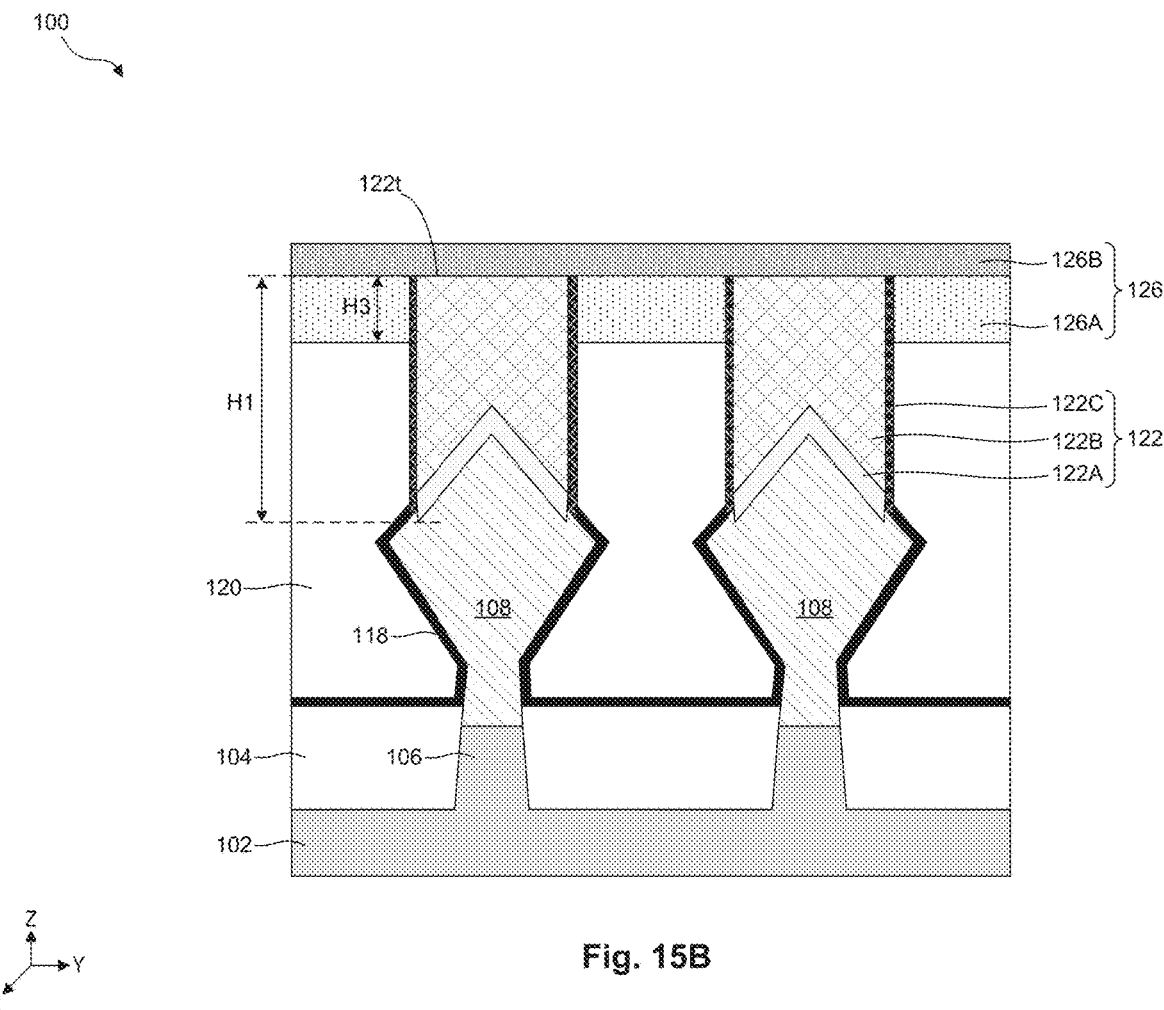
Figure 18A:
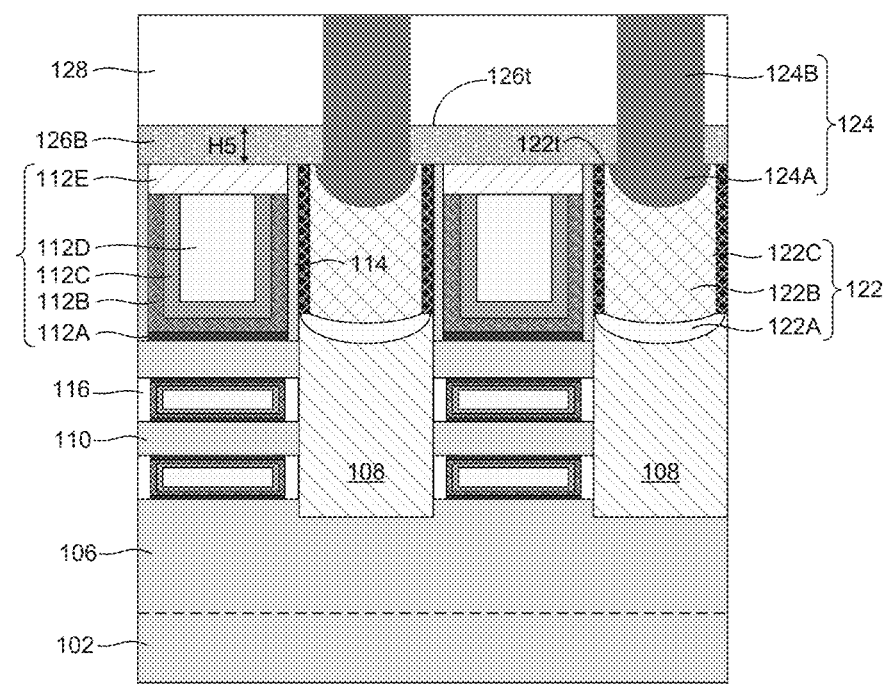
Figure 18A:
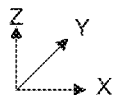
Figure 18B:
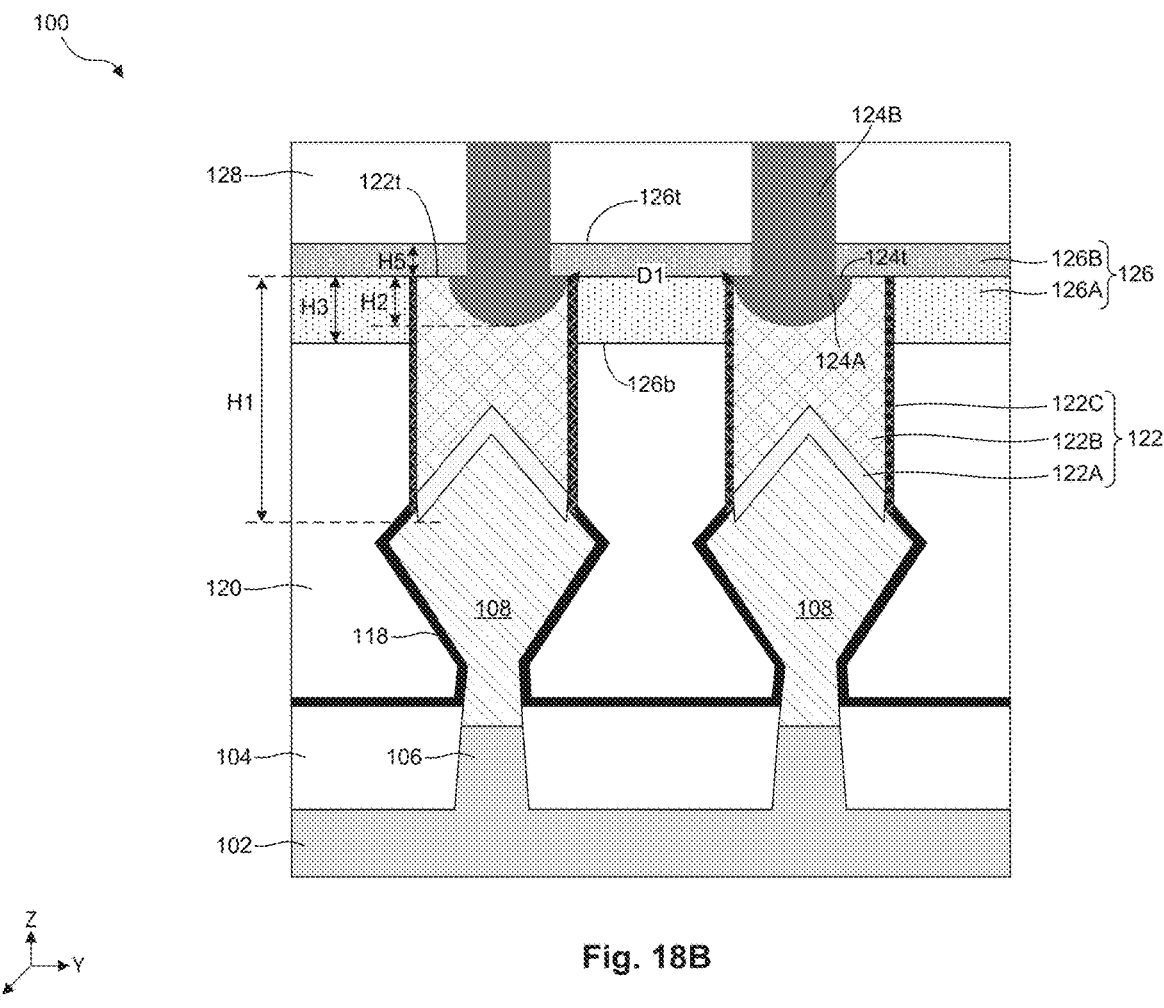

In some embodiments, as described with reference to FIGS. 7A-7B, 13A-13B, 14A-14B, and 15A-15B, barrier layer 126 of FIGS. 1H and 1I is formed on ILD layers 120. ILD layers 120 are not visible in the cross-sectional views of FIGS. 7A, 13A, 14A, and 15A. The formation of barrier layer 126 of FIGS. 1H and 1I can include sequential operations of (i) performing a dry etch process on the structures of FIGS. 6A and 6B to remove portions of ILD layers 120 and form recesses 730 with a height of H3 that exposes the sidewalls of contact structures 124 along YZ-planes, as shown in FIG. 7B, (ii) depositing an insulating layer 1326 having the material of barrier layer 126A on the structures of FIGS. 7A and 7B to fill recesses 730 and cover gate structures 112, outer gate spacers 114, and contact structures 122, as shown in FIGS. 13A and 13B, (iii) performing a CMP process on insulating layer 1326 to form first barrier layer 126A with its top surface substantially coplanarized with top surfaces 122t of contact structures 122, as shown in FIG. 14B (first barrier layer 126A not visible in the cross-sectional view of FIG. 14A), and (iv) depositing second barrier layer 126B on first barrier layer 126A, as shown in FIGS. 15A and 15B. The formation of barrier layer 126 can be followed by the deposition of ILD layer 128 on barrier layer 126, as shown in FIGS. 18A and 18B.

Referring to FIG. 2, in operation 235, via structures are formed on the contact structures through the barrier layer.

In some embodiments, via structures 124 are formed on contact structures 122 through barrier layer of FIGS. 1C and 1D by (i) forming via openings (not shown) in ILD layer 128, barrier layer 126 shown in FIGS. 9A and 9B, and contact plugs 122, (ii) depositing the metallic material of via structures 124 in the via openings and on ILD layer 128, and (iii) performing a CMP process on the metallic material to substantially coplanarize top surfaces of via structures with the top surface of ILD layer 128, as shown in FIGS. 16A and 16B.

In some embodiments, via structures 124 are formed on contact structures 122 through barrier layer of FIGS. 1F and 1G by (i) forming via openings (not shown) in ILD layer 128, barrier layer 126 shown in FIGS. 12A and 12B, and contact plugs 122, (ii) depositing the metallic material of via structures 124 in the via openings and on ILD layer 128, and (iii) performing a CMP process on the metallic material to substantially coplanarize top surfaces of via structures with the top surface of ILD layer 128, as shown in FIGS. 17A and 17B.

In some embodiments, via structures 124 are formed on contact structures 122 through barrier layer of FIGS. 1H and 1I by (i) forming via openings (not shown) in ILD layer 128, barrier layer 126 shown in FIGS. 15A and 15B, and contact plugs 122, (ii) depositing the metallic material of via structures 124 in the via openings and on ILD layer 128, and (iii) performing a CMP process on the metallic material to substantially coplanarize top surfaces of via structures with the top surface of ILD layer 128, as shown in FIGS. 18A and 18B.

The present disclosure provides example structures of barrier layers (e.g., barrier layer 126) between adjacent contact structures (e.g., contact structures 122) and between adjacent via structures (e.g., via structures 124) in FETs (e.g., FET 100) and provides methods (e.g., method 200) of forming the barrier layers. The barrier layers can prevent current leakage between the adjacent contact structures and between the adjacent via structures. In some embodiments, a FET can include contact structures disposed on S/D regions (e.g., S/D regions 108) and via structures disposed on the contact structures. First portions (e.g., via-bases 124A) of the via structures can be disposed in the contact structures and second portions (e.g., via-tops 124B) of the via structures can extend above the top surfaces of the contact structures. In some embodiments, the via-bases can be wider than the via-tops, which can result in adjacent via-bases being closer to each other than adjacent via-tops. In some embodiments, to prevent conductive material leakage between adjacent via-bases that are spaced apart from each other by a distance less than about 30 nm, the FET can include a barrier layer (e.g., barrier layer 126 shown in FIGS. 1C-1I) disposed between the adjacent via-bases. In some embodiments, the barrier layer can have a height equal to or greater than a height of the via-bases. In some embodiments, the barrier layer can include an insulating nitride layer with a high dielectric constant greater than about 7. The high dielectric constant of the barrier layer can minimize the probability of electrical breakdown of the barrier layer and prevent leakage of conductive material between the via-bases.

In some embodiments, a method includes forming a fin base on a substrate, epitaxially growing a S/D region on the fin base, depositing a dielectric layer on the S/D region, forming a contact structure on the S/D region through the dielectric layer, removing a portion of the dielectric layer to expose sidewalls of the contact structure, forming a barrier layer on the dielectric layer and to cover the exposed sidewalls of the contact structure, and forming a via structure on the contact structure through the barrier layer. The formation of the barrier layer includes depositing an insulating layer with a dielectric constant and a material density higher than a dielectric constant and a material density of the dielectric layer.

In some embodiments, a method includes forming a fin base on a substrate, forming a S/D region on a first portion of the fin base, forming a gate structure on a second portion of the fin base, depositing a dielectric layer on the S/D region, forming a contact structure on the S/D region through the dielectric layer, forming an insulating layer to cover top surfaces of the dielectric layer and the gate structure and sidewall portions of the contact structure that are non-overlapping with the dielectric layer and the gate structure, and forming a via structure on the contact structure through the insulating layer. The insulating layer includes a dielectric constant and a material density higher than a dielectric constant and a material density of the dielectric layer.

In some embodiments, a semiconductor device includes a substrate, a fin base disposed on the substrate, a S/D region disposed on the fin base, a nanostructured channel region disposed on the fin base, a gate structure surrounding the nanostructured change region, a dielectric layer disposed on the S/D region, and a contact structure disposed on the S/D region and in the dielectric layer. The contact structure includes a contact portion extending above a top surface of the dielectric layer. The semiconductor device further includes a barrier layer disposed on the dielectric layer and along sidewalls of the contact portion, and a via structure disposed in the contact structure and in the barrier layer. The barrier layer includes a dielectric constant and a material density higher than a dielectric constant and a material density of the dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin base on a substrate;
   epitaxially growing a source/drain (S/D) region on the fin base;
   depositing a dielectric layer on the S/D region;
   forming a contact structure on the S/D region through the dielectric layer;
   removing a portion of the dielectric layer to expose sidewalls of the contact structure;
   forming a barrier layer on the dielectric layer and to cover the exposed sidewalls of the contact structure, wherein forming the barrier layer comprises depositing an insulating layer with a dielectric constant and a material density higher than a dielectric constant and a material density of the dielectric layer; and
   forming a via structure on the contact structure through the barrier layer.

2. The method of claim 1, wherein forming the barrier layer comprises:
   depositing the insulating layer on the dielectric layer and to cover the exposed sidewalls and a top surface of the contact structure, wherein a top surface portion of the insulating layer overlapping the contact structure is formed with a substantially linear cross-sectional profile and a top surface portion of the insulating layer overlapping the dielectric layer is formed with a curved cross-sectional profile; and
   performing a polishing process on the insulating layer to form the barrier layer with a substantially planar top surface overlapping the contact structure and the dielectric layer.

3. The method of claim 1, wherein forming the barrier layer comprises:
   depositing the insulating layer on the dielectric layer and to cover the exposed sidewalls and a top surface of the contact structure, wherein a top surface portion of the insulating layer overlapping the contact structure is formed with a substantially linear cross-sectional profile and a top surface portion of the insulating layer overlapping the dielectric layer is formed with a curved cross-sectional profile; and
   depositing a second insulating layer, on the insulating layer, with a dielectric constant and a material density lower than the dielectric constant and material density of the insulating layer.

4. The method of claim 1, wherein forming the barrier layer comprises:
   depositing the insulating layer on the dielectric layer and to cover the exposed sidewalls and a top surface of the contact structure;
   performing a polishing process on the insulating layer to substantially coplanarize top surfaces of the insulating layer and the contact structure; and
   depositing a second insulating layer, on the insulating layer, with a dielectric constant and a material density lower than the dielectric constant and material density of the insulating layer.

5. The method of claim 1, wherein forming the barrier layer comprises forming the barrier layer to extend above and below the top surface of the contact structure.

6. The method of claim 1, wherein forming the barrier layer comprises forming the barrier layer to extend below a top surface of the contact structure.

7. The method of claim 1, wherein forming the barrier layer comprises forming the barrier layer with a top surface that is substantially coplanar with a top surface of the contact structure and with a bottom surface that is below a bottom surface of the via structure.

8. The method of claim 1, wherein forming the barrier layer comprises depositing a nitride layer or a carbide layer with a dielectric constant and a material density higher than the dielectric constant and the material density of the dielectric layer.

9. The method of claim 1, wherein forming the barrier layer comprises depositing a silicon nitride layer on the dielectric layer.

10. The method of claim 1, wherein forming the via structure comprises forming a via-base in the contact structure and a via-top in the barrier layer.

11. A method, comprising:
forming a fin base on a substrate;
forming a source/drain (S/D) region on a first portion of the fin base;
forming a gate structure on a second portion of the fin base;
depositing a dielectric layer on the S/D region;
forming a contact structure on the S/D region through the dielectric layer;
forming an insulating layer to cover top surfaces of the dielectric layer and the gate structure and sidewall portions of the contact structure that are non-overlapping with the dielectric layer and the gate structure, wherein the insulating layer comprises a dielectric constant and a material density higher than a dielectric constant and a material density of the dielectric layer; and
forming a via structure on the contact structure through the insulating layer.

12. The method of claim 11, wherein forming the insulating layer comprises forming the insulating layer to extend a first distance below a top surface of the contact structure and to extend a second distance above a top surface of the contact structure and the top surface of the gate structure, wherein the first distance is greater than the second distance.

13. The method of claim 11, wherein forming the insulating layer comprises forming the insulating layer to extend below a bottom surface of the via structure and to extend above the top surface of the gate structure.

14. The method of claim 11, wherein forming the insulating layer comprises:
etching the dielectric layer to expose the sidewall portions of the contact structure;
depositing a first nitride layer on the dielectric layer and to cover the exposed sidewall portions and a top surface of the contact structure; and
depositing a second nitride layer on the first nitride layer.

15. The method of claim 11, wherein forming the insulating layer comprises:
etching the dielectric layer to expose the sidewall portions of the contact structure;
depositing a nitride layer on the dielectric layer and to cover the exposed sidewall portions and a top surface of the contact structure; and
performing a polishing process to substantially coplanarize top surfaces of the nitride layer and the contact structure.

16. The method of claim 11, wherein forming the insulating layer comprises:
depositing a first nitride layer on the dielectric layer to extend a first distance below a top surface of the contact structure and to extend a second distance above a top surface of the gate structure, wherein the first distance is greater than the second distance; and
depositing a second nitride layer on the first nitride layer.

17. A semiconductor device, comprising:
a substrate;
a fin base disposed on the substrate;
a source/drain (S/D) region disposed on the fin base;
a gate structure disposed on the fin base;
a dielectric layer disposed on the S/D region;
a contact structure disposed on the S/D region and in the dielectric layer, wherein the contact structure comprises a contact portion extending above a top surface of the dielectric layer;
a barrier layer disposed on the dielectric layer and along sidewalls of the contact portion, wherein the barrier layer comprises a dielectric constant and a material density higher than a dielectric constant and a material density of the dielectric layer; and
a via structure disposed in the contact structure and in the barrier layer.

18. The semiconductor device of claim 17, wherein the barrier layer extends a first distance below a top surface of the contact structure and extends a second distance above a top surface of the gate structure, wherein the first distance is greater than the second distance.

19. The semiconductor device of claim 17, wherein the barrier layer comprises:
a first nitride layer disposed on the dielectric layer, on top surfaces of the contact structure and the gate structure, and along the sidewalls of the contact portion; and
a second nitride layer disposed on the first nitride layer.

20. The semiconductor device of claim 17, wherein the barrier layer comprises a first insulating layer and a second insulating layer with a dielectric constant and a material density lower than a dielectric constant and a material density of the first insulating layer.

* * * * *